(12) United States Patent
Miyazaki et al.

(10) Patent No.: US 9,897,490 B2
(45) Date of Patent: Feb. 20, 2018

(54) TEMPERATURE MEASUREMENT DEVICE, INTEGRATED CIRCUIT, AND TEMPERATURE MEASUREMENT METHOD

(71) Applicant: SOCIONEXT INC., Yokohama-shi, Kanagawa (JP)

(72) Inventors: Takashi Miyazaki, Akiruno (JP); Hiroyuki Hamano, Sagamihara (JP)

(73) Assignee: SOCIONEXT INC., Yokohama (JP)

( * ) Notice: Subject to any disclaimer, the term of this patent is extended or adjusted under 35 U.S.C. 154(b) by 300 days.

(21) Appl. No.: 14/618,911

(22) Filed: Feb. 10, 2015

(65) Prior Publication Data

US 2015/0276497 A1    Oct. 1, 2015

(30) Foreign Application Priority Data

Mar. 27, 2014    (JP) ................................ 2014-066779

(51) Int. Cl.
*G01K 7/01* (2006.01)
*H03M 1/36* (2006.01)
(Continued)

(52) U.S. Cl.
CPC ................. *G01K 7/01* (2013.01); *G01K 7/16* (2013.01); *H03M 1/36* (2013.01)

(58) Field of Classification Search
CPC ............ G01K 7/01; G01K 7/015; G01K 7/16; H03M 1/36
See application file for complete search history.

(56) References Cited

U.S. PATENT DOCUMENTS 5,498,971 A * 3/1996 Turnbull .................. G01K 7/01
                                                    365/211
5,982,221 A * 11/1999 Tuthill ..................... G01K 7/01
                                                    257/E23.08
(Continued)

FOREIGN PATENT DOCUMENTS

CN         101655395 A      2/2010
CN         101660953 A      3/2010
(Continued)

OTHER PUBLICATIONS

Computer Translation of CN 101655395, "Temperature Measurment System and Temperature Measurement Method", ProQuest, LLC. © 2017.*

(Continued)

*Primary Examiner* — Randy Gibson
(74) *Attorney, Agent, or Firm* — Arent Fox LLP

(57) ABSTRACT

In a first sensing state in which a first current flows in a forward direction with respect to a pn junction of a first semiconductor element and a second current of a different magnitude from the first current flows in a forward direction with respect to a pn junction of a second semiconductor element, a difference between a forward direction voltage of the pn junction of the first semiconductor element and a forward direction voltage of the pn junction of the second semiconductor element is converted into a digital value by a computer and acquired as a first digital value. In a second sensing state in which the second current flows in the forward direction in the pn junction of the first semiconductor element and the first current flows in the forward direction in the pn junction of the second semiconductor element, a difference between the forward direction voltage of the pn junction of the first semiconductor element and the forward direction voltage of the pn junction of the second semiconductor element is converted into a digital value by (Continued)

the computer and acquired as a second digital value. A temperature measurement value is computed based on an average value of the first digital value and the second digital value by the computer.

19 Claims, 21 Drawing Sheets

(51) Int. Cl.
*G01K 1/16* (2006.01)
*G01K 7/16* (2006.01)

(56) References Cited

U.S. PATENT DOCUMENTS

| | | | | |
|---|---|---|---|---|
| 6,149,299 | A | 11/2000 | Aslan et al. | |
| 6,198,267 | B1* | 3/2001 | Bakker | G01K 7/01 323/316 |
| 6,242,974 | B1* | 6/2001 | Kunst | G01K 7/01 327/554 |
| 6,342,997 | B1* | 1/2002 | Khadkikar | G01K 7/01 361/100 |
| 6,736,540 | B1* | 5/2004 | Sheehan | G01K 7/01 327/572 |
| 6,869,216 | B1* | 3/2005 | Holloway | G01K 1/028 341/143 |
| 6,962,436 | B1* | 11/2005 | Holloway | G01K 1/028 341/143 |
| 7,048,438 | B2* | 5/2006 | Breinlinger | G01K 7/01 257/467 |
| 7,082,377 | B1* | 7/2006 | Aslan | G01K 7/01 327/512 |
| 7,112,948 | B2* | 9/2006 | Daly | G05F 3/30 323/316 |
| 7,197,421 | B2* | 3/2007 | Pan | G01K 7/01 374/178 |
| 7,281,846 | B2* | 10/2007 | McLeod | G01K 7/01 327/513 |
| 7,429,129 | B2* | 9/2008 | St. Pierre | G01K 7/01 327/512 |
| 7,579,899 | B2* | 8/2009 | Senriuchi | G01D 3/036 327/512 |
| 7,686,508 | B2* | 3/2010 | Lin | G01K 7/015 327/512 |
| 8,350,552 | B1* | 1/2013 | Marten | G01K 7/01 323/283 |
| 9,116,048 | B2* | 8/2015 | Trampitsch | G01K 7/01 |
| 9,121,768 | B2* | 9/2015 | Raychowdhury | G01K 7/015 |
| 9,250,137 | B2* | 2/2016 | Welland | G01K 7/01 |
| 9,506,817 | B2* | 11/2016 | Qiu | G01K 7/01 |
| 9,557,226 | B2* | 1/2017 | Eberlein | G01K 7/01 |
| 2009/0322579 | A1 | 12/2009 | Matsuda | |
| 2010/0002747 | A1 | 1/2010 | Bosch et al. | |
| 2012/0087390 | A1* | 4/2012 | Raychowdhury | G01K 7/015 374/170 |
| 2014/0086279 | A1* | 3/2014 | Cao | G01K 7/01 374/183 |
| 2014/0139246 | A1* | 5/2014 | Chuang | G01R 31/2874 324/750.06 |
| 2016/0252409 | A1* | 9/2016 | Lu | G01K 7/22 702/99 |

FOREIGN PATENT DOCUMENTS

| | | |
|---|---|---|
| JP | H07-160367 A | 6/1995 |
| JP | H11-211574 A | 8/1999 |
| JP | 2010-010921 A | 1/2010 |
| JP | 2011-527009 A | 10/2011 |
| JP | 2013-019738 A | 1/2013 |

OTHER PUBLICATIONS

"Voltage Dividers" tutitorial from "Learn SpartFun" website (https://learn.sparkfun.com/tutorials/voltage-dividers). downloaded May 2017.*

Chinese Office Action of related Chinese Patent Application No. 201510088732.5 dated Jan. 24, 2017.

Pertijs et al., "A CMOS Temperature Sensor with a 3σ Inaccuracy of ±0.1° C from −55° C to 125° C" IEEE International Solid-State Circuits Conference. ISSCC. Session 13. Feb. 8, 2005.

Japanese Office Action of related Japanese Patent Application No. 2014-066779 dated Dec. 12, 2017.

* cited by examiner

FIG.16

| CURRENT SOURCE STATE | Q3, R3 CURRENT | Q4, R4 CURRENT | INVERTING INPUT TERMINAL | NON-INVERTING INPUT TERMINAL | OPERATIONAL AMPLIFIER OUTPUT POLARITY | SENSOR STATE | Q1, R1 CURRENT | Q2, R2 CURRENT | MEASUREMENT VOLTAGE | MEASURE-MENT POLARITY | DIGITAL VALUE SYMBOL |
|---|---|---|---|---|---|---|---|---|---|---|---|
| FIRST CURRENT CONTROL STATE | I3 | I4 | CONNECTED TO NODE n12 | CONNECTED TO NODE n9 | IN-PHASE | FIRST SENSING STATE | I1 | I2 | VOLTAGE ACROSS BOTH ENDS OF R1 | − | V1 |
| | | | | | | | | | ΔVbe | | V2 |
| | | | | | | | | | VOLTAGE ACROSS BOTH ENDS OF R2 | | V3 |
| | | | | | SECOND SENSING STATE | I2 | I1 | VOLTAGE ACROSS BOTH ENDS OF R1 | + | V4 |
| | | | | | | | | | ΔVbe | | V5 |
| | | | | | | | | | VOLTAGE ACROSS BOTH ENDS OF R2 | | V6 |
| SECOND CURRENT CONTROL STATE | I4 | I3 | CONNECTED TO NODE n10 | CONNECTED TO NODE n11 | OUT-OF-PHASE | FIRST SENSING STATE | I1 | I2 | VOLTAGE ACROSS BOTH ENDS OF R1 | − | V7 |
| | | | | | | | | | ΔVbe | | V8 |
| | | | | | | | | | VOLTAGE ACROSS BOTH ENDS OF R2 | | V9 |
| | | | | | SECOND SENSING STATE | I2 | I1 | VOLTAGE ACROSS BOTH ENDS OF R1 | + | V10 |
| | | | | | | | | | ΔVbe | | V11 |
| | | | | | | | | | VOLTAGE ACROSS BOTH ENDS OF R2 | | V12 |

TEMPERATURE MEASUREMENT DEVICE, INTEGRATED CIRCUIT, AND TEMPERATURE MEASUREMENT METHOD

CROSS-REFERENCE TO RELATED APPLICATION

This application is based upon and claims the benefit of priority of the prior Japanese Patent Application No. 2014-066779, filed on Mar. 27, 2014, the entire contents of which are incorporated herein by reference.

FIELD

The embodiments discussed herein are related to a temperature measurement device, an integrated circuit, and a temperature measurement method.

BACKGROUND

A temperature measurement device is known that utilizes a characteristic of proportionality between the inter-base-emitter voltage difference of a pair of bipolar transistors supplied with mutually different emitter currents, and the absolute temperature. In this type of temperature measurement device, errors in temperature measurement values are caused by a mismatch between the pair of bipolar transistors (relative variation of the characteristics) and the like. Dynamic element matching is used as a method of minimizing temperature measurement value errors arising from the mismatch between the pair of bipolar transistors and the like.

Related Non-Patent Documents

ISSCC 2005/SESSION 13/SENSORS/13.1 "A CMOS Temperature Sensor with a 3σ Inaccuracy of ±0.1° C. from −55° C. to 125° C." by Michiel Pertijs, Kofi Makinwa and Johan Huij sing.

SUMMARY

According to an aspect of the embodiments, a temperature measurement device includes: a first semiconductor element and a second semiconductor element that include respective pn junctions; a first current output circuit configured to output a first current and a second current of a different magnitude from the first current in accordance with a control voltage supplied to a current control terminal; a first connection switching circuit configured to switch connections of the first semiconductor element and the second semiconductor element with the first current output circuit so as to give either state of a first sensing state in which the first current flows in a forward direction with respect to the pn junction of the first semiconductor element and the second current flows in a forward direction with respect to the pn junction of the second semiconductor element, or a second sensing state in which the first current flows in the forward direction with respect to the pn junction of the second semiconductor element and the second current flows in the forward direction with respect to the pn junction of the first semiconductor element; an AD convertor configured to convert, in the first sensing state, a difference between a forward direction voltage of the pn junction of the first semiconductor element and a forward direction voltage of the pn junction of the second semiconductor element into a digital value and output the converted digital value as a first digital value, and configured to convert, in the second sensing state, a difference value between the forward direction voltage of the pn junction of the first semiconductor element and the forward direction voltage of the pn junction of the second semiconductor element into a digital value and output the converted digital value as a second digital value; and a computation circuit configured to compute a temperature measurement value based on an average value of the first digital value and the second digital value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 16 is a diagram illustrating correspondence relationships between a state of a temperature measurement device, and a voltage measured in an AD convertor and a corresponding digital value according to an exemplary embodiment of technology disclosed herein.

DESCRIPTION OF EMBODIMENTS

Figure 1:
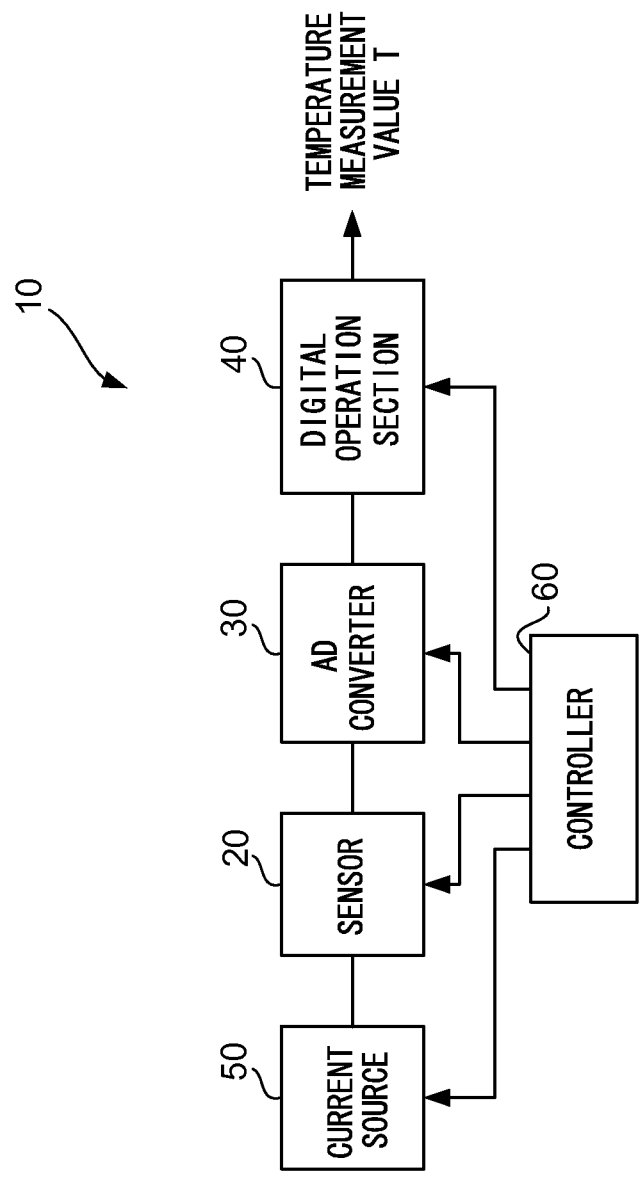
FIG. 1 is a block diagram illustrating a configuration of a temperature measurement device according to an exemplary embodiment of technology disclosed herein.

Explanation follows regarding examples of technology disclosed herein, with reference to the drawings. The same or equivalent configuration elements and portions are allocated the same reference numerals in each of the drawings.

First Exemplary Embodiment

FIG. 1 is a block diagram illustrating a configuration of a temperature measurement device 10 according to technology disclosed herein. The temperature measurement device 10 includes a sensor 20, an AD converter 30, a digital operation section 40, a current source 50, and a controller 60. The temperature measurement device 10 is an example of a temperature measurement device according to technology disclosed herein.

The sensor 20 includes a pair of semiconductor elements with pn junctions, and outputs a voltage of magnitude according to the ambient temperature. The AD converter 30 converts the voltage output from the sensor 20 into a digital value. The digital operation section 40 computes a temperature measurement value T by performing computation processing on the digital value output from the AD converter 30. The current source 50 controls current supplied to the pair of semiconductor elements in the sensor 20. The controller 60 performs overall control of the sensor 20, the AD converter 30, the digital operation section 40, and the current source 50.

Figure 2:
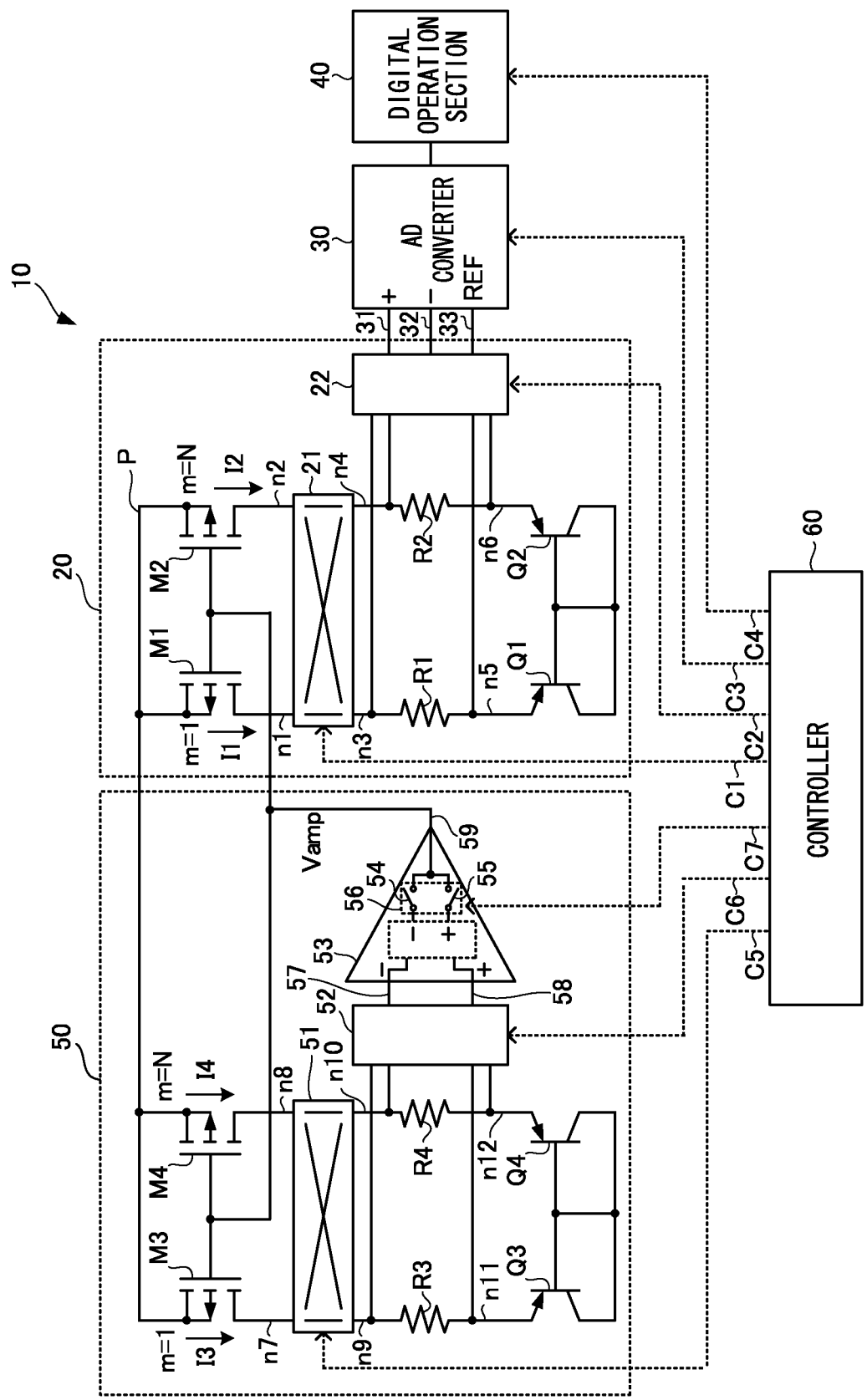
FIG. 2 is a block diagram illustrating a detailed configuration of a temperature measurement device according to an exemplary embodiment of technology disclosed herein.

FIG. 2 is a circuit block diagram illustrating a detailed configuration of the temperature measurement device 10.

The sensor 20 includes bipolar transistors Q1 and Q2 (referred to below as transistor Q1, transistor Q2) as a pair of semiconductor elements with pn junctions. The transistors Q1 and Q2 are, for example, pnp transistors. The transistors Q1 and Q2 may be npn transistors. It is also possible to employ diodes in place of bipolar transistors. The bases and collectors of the transistors Q1 and Q2 are respectively connected to a common potential (for example to ground potential). The emitter of the transistor Q1 is connected to a resistor element R1, and the emitter of the transistor Q2 is connected to a resistor element R2. The transistor Q1 is an example of a first semiconductor element of technology disclosed herein, and the transistor Q2 is an example of a second semiconductor element of technology disclosed herein. The resistor element R1 is an example of a first resistor element of technology disclosed herein, and the second resistor element R2 is an example of a second resistor element of technology disclosed herein.

Field effect transistors M1 and M2 (referred to below as transistor M1, transistor M2) are, for example, p-channel MOSFETs. The sources of the transistors M1 and M2 are respectively connected to power source line P, and the gates of the transistors M1 and M2 that are the current control terminals are connected to an output terminal 59 of an operational amplifier 53 of the current source 50. The transistor M1 outputs a current I1 (of current value i1) according to a control voltage Vamp supplied to its own gate from the operational amplifier 53. The transistor M2 outputs a current I2 (of current value i2) according to a control voltage Vamp supplied to its own gate from the operational amplifier 53. The transistor M2 has a configuration in which N transistors that are similar to the transistor M1 are connected together in parallel. The current value i2 of the current I2 output from the transistor M2 is accordingly approximately N times the current value i1 of the current I1 output by the transistor M1 (current ratio i1:i2=1:N). The transistors M1, M2 are examples of a first current output section of technology disclosed herein.

A first connection switching section 21 is provided between the transistors M1 and M2, and the resistor elements R1 and R2. The first connection switching section 21 switches the connection destination of nodes n1 and n2 of the drains of the transistors M1, M2 according to a control signal C1 supplied from the controller 60. In a first sensing state of the first connection switching section 21, described below, the node n1 is connected to a node n3 on the high potential side of the resistor element R1, and the node n2 is connected to a node n4 on the high potential side of the second resistor element R2. In a second sensing state of the first connection switching section 21, described below, the node n1 is connected to the node n4, and the node n2 is connected to the node n3. The first connection switching section 21 is an example of a first connection switching section of technology disclosed herein.

A second connection switching section 22 selectively connects the nodes n3, n4 and nodes n5, n6 of the emitters of the transistors Q1, Q2 (on the low voltage side of the resistor elements R1, R2) to each of the input terminals of the AD converter 30 according to the control signal C2 supplied from the controller 60. Explanation is given below regarding the connection relationship between the AD converter 30 and each of the nodes n3 to n6 through the second connection switching section 22. The second connection switching section 22 is an example of a second connection switching section according to technology disclosed herein.

The AD converter 30 includes a positive side input terminal 31, a negative side input terminal 32, and a reference voltage input terminal 33. The AD converter 30 outputs a digital value expressing the difference between the voltage of the node connected to the positive side input terminal 31 and the voltage of the node connected to the negative side input terminal 32, as a ratio to the reference voltage input to the reference voltage input terminal 33. Output from the AD converter 30 is effected by a control signal C3 supplied from the controller 60. The digital value output from the AD converter 30 is supplied to the digital operation section 40. The AD converter 30 may, for example, be a single bit delta-sigma modulation AD converter. A single bit delta-sigma modulation AD converter has the characteristics of good linearity, and relatively small circuit surface area for its resolution. The AD converter 30 is an example of an AD converter of technology disclosed herein.

Figure 3:
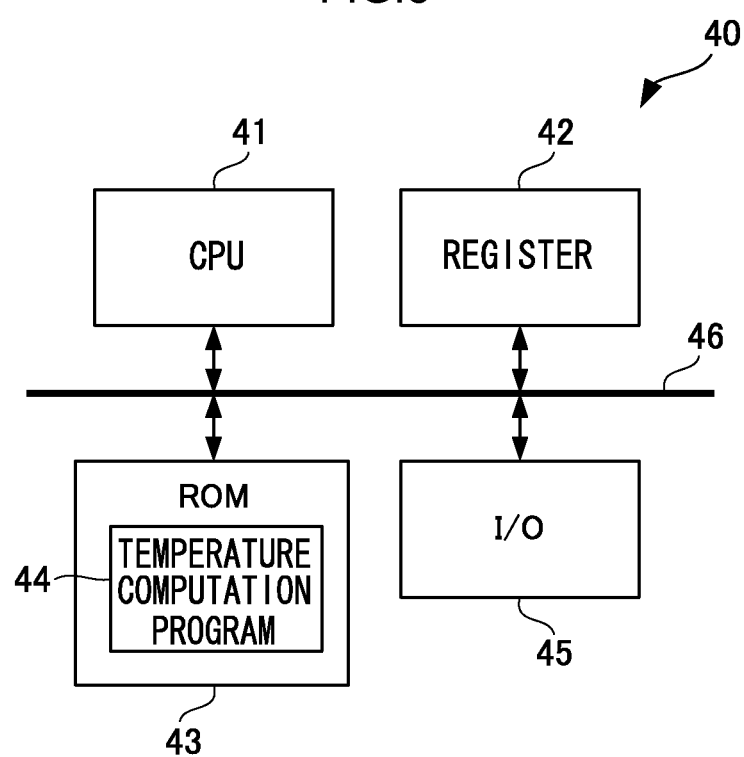
FIG. 3 is a block diagram illustrating a configuration of a digital operation section according to an exemplary embodiment of technology disclosed herein.

The digital operation section 40 computes a temperature measurement value T by performing computation processing on the digital value output from the AD converter 30. FIG. 3 is a block diagram illustrating a detailed configuration of the digital operation section 40. The digital operation section 40 is configured including a computer, and includes a Central Processing Unit (CPU) 41, a register 42, Read Only Memory (ROM) 43, and an input/output port (I/O) 45. The CPU 41, the register 42, the ROM 43, and the input/output port I/O 45 are connected together through a bus 46. The digital value output from the AD converter 30 is imported into the digital operation section 40 through the input/output port (I/O) 45, and stored in the register 42. A temperature computation program 44 for computing the temperature measurement value T is stored in the ROM 43. Based on a control signal C4 supplied from the controller 60, the CPU 41 starts performing computation processing using the digital value stored in the register 42 by executing the temperature computation program 44, and computes the temperature measurement value T. The computed temperature measurement value T is externally output through the input/output port (I/O) 45. Details regarding the temperature computation program 44 are given below. The digital operation section 40 is an example of an operation section of technology disclosed herein. The register 42 is an example of a storage section of technology disclosed herein.

The current source 50 includes a pair of bipolar transistors Q3 and Q4 (referred to below as transistor Q3 and transistor Q4) as a pair of semiconductor elements with pn junctions. The transistors Q3 and Q4 are, for example, pnp transistors. The transistors Q3 and Q4 may be npn transistors. It is also possible to employ diodes in place of bipolar transistors. The bases and collectors of the transistors Q3 and Q4 are respectively connected to a common potential (for example to ground potential). The emitter of the transistor Q3 is connected to a resistor element R3, and the emitter of the transistor Q4 is connected to a resistor element R4. The transistor Q3 is an example of a third semiconductor element of technology disclosed herein, and the transistor Q4 is an example of a fourth semiconductor element of technology disclosed herein.

Field effect transistors M3 and M4 (referred to below as transistor M3 and transistor M4) are, for example, p-channel MOSFETs. The sources of the transistors M3 and M4 are respectively connected to the power source line P, and the gates of the transistors M3 and M4 that are the current control terminals are connected to the output terminal 59 of the operational amplifier 53. The transistor M3 outputs a current I3 (of current value i3) according to a control voltage Vamp supplied to its own gate from the operational amplifier 53. The transistor M4 outputs a current I4 (of current value i4) according to a control voltage Vamp supplied to its own gate from the operational amplifier 53. The transistor M4 has a configuration in which N transistors that are similar to the transistor M3 are connected together in parallel. The current value i4 of the current I4 output from the transistor M4 is accordingly approximately N times the current value i3 of the current I3 from the transistor M3, (current ratio i3:i4=1: N). The transistors M3, M4 are examples of a second current output section of technology disclosed herein.

A third connection switching section 51 is provided between the transistors M3 and M4, and the resistor elements R3 and R4. The third connection switching section 51 switches the connection destination of nodes n7 and n8 of the drains of the transistors M3, M4 according to a control signal C5 supplied from the controller 60. In a first current control state of the third connection switching section 51, described below, the node n7 is connected to a node n9 on the high potential side of the resistor element R3, and the node n8 is connected to a node n10 on the high potential side of the second resistor element R4. In a second current control state of the third connection switching section 51, described below, the node n7 is connected to the node n10, and the node n8 is connected to the node n9. The third connection switching section 51 is an example of a third connection switching section of technology disclosed herein.

A fourth connection switching section 52 selectively connects the nodes n9, n10 and nodes n11, n12 of the emitters of the transistors Q3, Q4 to an inverting input terminal 57 and a non-inverting input terminal 58 of the operational amplifier 53 according to a control signal C6 supplied from the controller 60. Explanation is given below regarding the connection relationship between the operational amplifier 53 and each of the nodes n9 to n12 through the fourth connection switching section 52. The fourth connection switching section 52 is an example of a fourth connection switching section of technology disclosed herein.

The operational amplifier 53 includes the inverting input terminal 57 connected through the fourth connection switching section 52 to one out of the transistors Q3 and Q4, and the non-inverting input terminal 58 is connected to the other out of the transistors Q3 and Q4. In the first current control state and the second current control state, the operational amplifier 53 generates an output voltage that controls the magnitudes of each of the currents I1 to I4 to correspond to the difference between the inter-base-emitter voltage of the transistor Q3 and the inter-base-emitter voltage of the transistor Q4. The operational amplifier 53 outputs the output voltage from the output terminal 59 as control voltage Vamp. The output terminal 59 of the operational amplifier 53 is connected to the gates that are the current control terminals of the transistors M1 to M4. The transistors M1 to M4 output currents I1 to I4 of magnitude according to the control voltage Vamp supplied from the operational amplifier 53. The operational amplifier 53 is an example of an operational amplifier of technology disclosed herein.

The operational amplifier 53 includes an internal fifth connection switching section 56. The fifth connection switching section 56 includes switches 54 and 55 that, based on a control signal C7 supplied from the controller 60, switch between outputting the control voltage Vamp in-phase or out-of-phase with respect to the non-inverting input terminal 58. For example, when the control voltage Vamp is being output in-phase, the switch 55 is in the ON state, and the switch 54 is in the OFF state. When the control voltage Vamp is being output in-phase with respect to the non-inverting input terminal 58, the magnitude of the control voltage Vamp increases as the potential input to the non-inverting input terminal 58 rises. However, when the control voltage Vamp is being output out-of-phase with respect to the non-inverting input terminal 58, the switch 54 is in the ON state, and the switch 55 is in the OFF state. When the control voltage Vamp is output out-of-phase with respect to the non-inverting input terminal 58, the magnitude of the control voltage Vamp increases as the potential input to the inverting input terminal 57 rises. The fifth connection switching section 56 is an example of a fifth connection switching section of technology disclosed herein.

Figure 4:
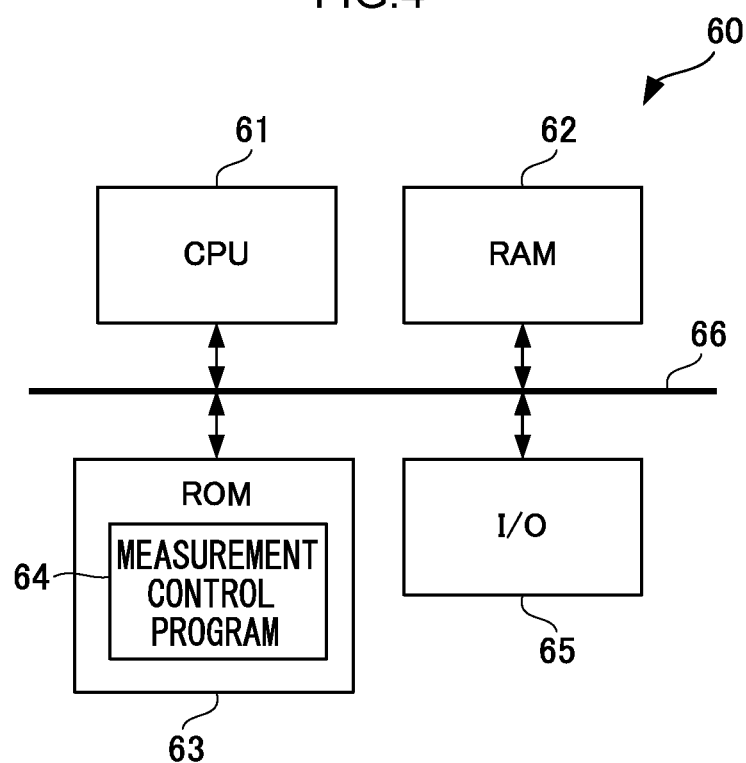
FIG. 4 is a block diagram illustrating a configuration of a controller according to an exemplary embodiment of technology disclosed herein.

The controller 60 controls the sensor 20, the AD converter 30, the digital operation section 40, and the current source 50 overall by supplying the control signals C1 to C7 thereto. FIG. 4 is a block diagram illustrating a detailed configuration of the controller 60. The controller 60 is configured including a computer, and includes a Central Processing Unit (CPU) 61, Random Access Memory (RAM) 62, ROM 63, and an input/output port (I/O) 65. The CPU 61, the RAM 62, the ROM 63, and the input/output port (I/O) 65 are connected together through a bus 66. A measurement control program 64 is stored in the ROM 63 listing a cycle of processing to obtain the temperature measurement value T by controlling the sensor 20, the AD converter 30, the digital operation section 40, and the current source 50. The CPU 61 generates control signals C1 to C7 by executing the measurement control program 64, and supplies the control signals to the sensor 20, the AD converter 30, the digital operation section 40, and the current source 50. The sensor 20, the AD converter 30, the digital operation section 40, and the current source 50 are operated according to the control signals C1 to C7 supplied from the controller 60. Plural digital values are thereby output from the AD converter 30, and the temperature measurement value T computed based on the plural digital values is output from the digital operation section 40.

Figure 5:
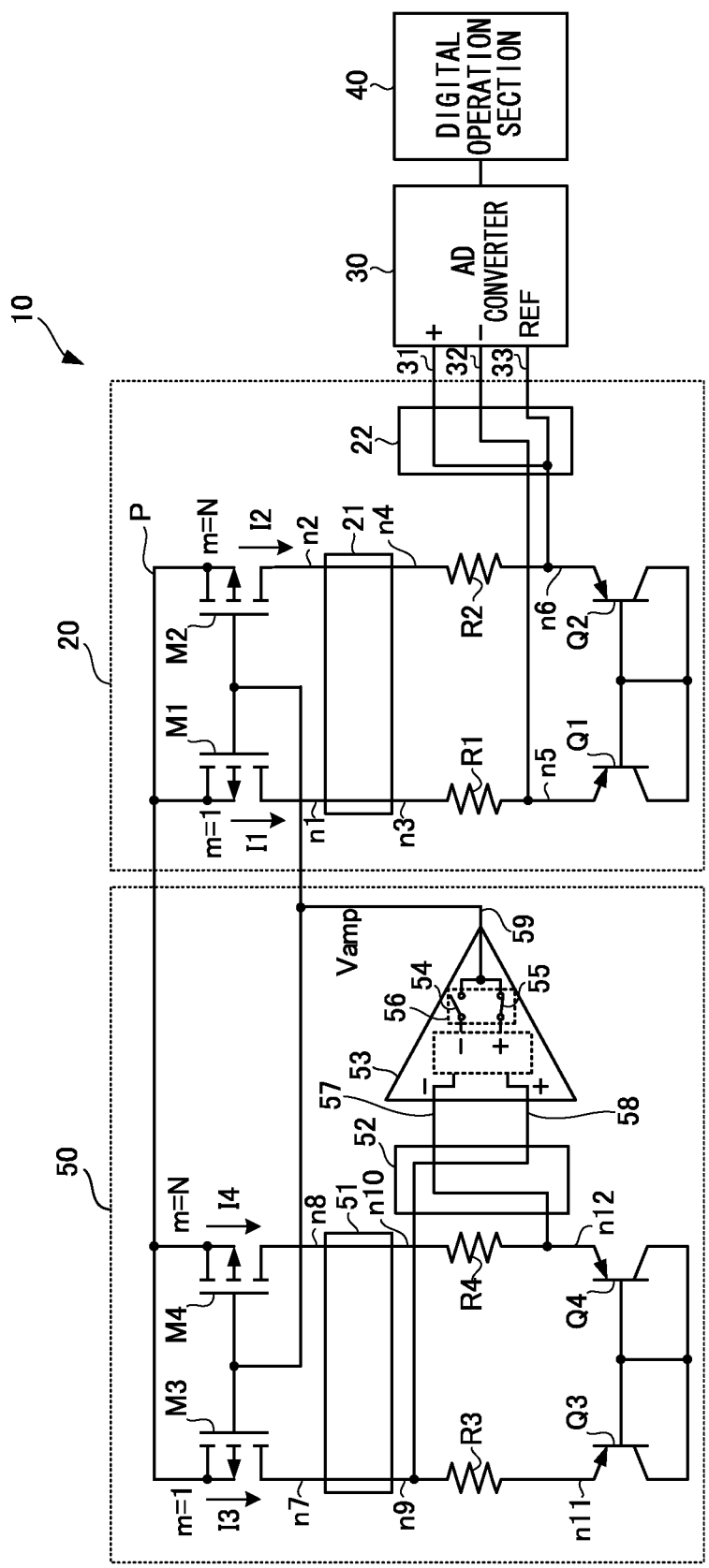
FIG. 5 is a diagram illustrating an example of a connection configuration of a temperature measurement device according to an exemplary embodiment of technology disclosed herein.

Explanation follows regarding a principle of temperature measurement in the temperature measurement device 10. FIG. 5 illustrates an example of connection states in the temperature measurement device 10.

In the example illustrated in FIG. 5, the node n1 and the node n3, and the node n2 and the node n4, of the sensor 20 are respectively connected together by the first connection switching section 21. The node n5 of the sensor 20 is connected to the negative side input terminal 32 of the AD converter 30, and the node n6 of the sensor 20 is connected to the positive side input terminal 31 of the AD converter 30, by the second connection switching section 22. The node in which the current I2 with the larger current value flows from out of the nodes n5 and n6 is connected to the reference voltage input terminal 33 of the AD converter 30. Namely, in the example illustrated in FIG. 5, the node n6 is connected by the second connection switching section 22 to the reference voltage input terminal 33 of the AD converter 30. In the example illustrated in FIG. 5, the node n7 and the node n9, and the node n8 and the node n10, of the current source 50 are respectively connected together by the third connection switching section 51. The node n9 of the current source 50 is connected to the non-inverting input terminal 58 of the operational amplifier 53, and the node n12 is connected to the inverting input terminal 57 of the operational amplifier 53, by the fourth connection switching section 52. The example illustrated in FIG. 5 is of an ON state of the switch 55 of the fifth connection switching section 56. The control voltage Vamp that is the output voltage from the operational amplifier 53 is thereby output in-phase.

In the connection state illustrated in FIG. 5, the current I3 output from the transistor M3 of the current source 50 flows in the resistor element R3 and the transistor Q3, and the current I4 output from the transistor M4 flows in the resistor element R4 and the transistor Q4. The difference between the inter-base-emitter voltage of the transistor Q4 (namely the voltage of the node n12) and the inter-base-emitter voltage of the transistor Q3 (namely the voltage of the node n11) is denoted $\Delta Vbe1$, and the resistance value of the resistor element R3 is denoted r3. In such a case, the current value i3 of the current I3 and the current value i4 of the current I4 are expressed by the following Equation (1) and Equation (2), respectively.

Equation (1)
$$i3 = \frac{\Delta Vbe1}{r3} \tag{1}$$

Equation (2)
$$i4 = N \times i3 \tag{2}$$

Namely, the operational amplifier 53 outputs the control voltage Vamp that satisfies Equation (1). Note that N in Equation (2) is a current ratio between the current I3 and the current I4 (i4/i3), and is determined by the configuration of the transistors M3 and M4.

As can be seen from Equation (1) and Equation (2), the current values i3 and i4 are proportional to $\Delta Vbe1$, and do not depend on the magnitude of the voltage of power source line P. The control voltage Vamp output from the operational amplifier 53 is also supplied to the gates of the transistors M1 and M2 of the sensor 20. Thus, the current value it of the current I1 and the current value i2 of the current I2 are also proportional to $\Delta Vbe1$, and do not depend on the magnitude of the voltage of the power source line P. In this manner, the operational amplifier 53 generates the control voltage Vamp that controls the magnitudes of the current values i1 to i4 of the currents I1 to I4 to be proportional to $\Delta Vbe1$, and supplies the control voltage Vamp to the gates of the transistors M1 to M4. As a result, the currents I1 to I4 are currents with no dependency on the source voltage.

In the connection state illustrated in FIG. 5, the current I1 output from the transistor M1 of the sensor 20 flows in the resistor element R1 and the transistor Q1, and the current I2 output from the transistor M2 flows in the resistor element R2 and the transistor Q2. The current I1 flows in the forward direction with respect to the pn junction of the transistor Q1, and the current I2 flows in the forward direction with respect to the pn junction of the transistor Q2. The difference between the inter-base-emitter voltage of the transistor Q2 (namely the voltage of the node n6) and the inter-base-emitter voltage of the transistor Q1 (namely the voltage of the node n5) is denoted $\Delta Vbe$. Namely, the $\Delta Vbe$ is the difference between the forward direction voltage at the pn junction of the transistor Q2, and the forward direction voltage at the pn junction of the transistor Q1. The inter-base-emitter voltage of the transistor Q2 in which the larger current value current I2 out of the currents I1 and I2 flows (namely the voltage of the node n6) is denoted Vbe. This thereby enables the temperature measurement value T (° C.) to be expressed by the following Equation (3) and Equation (4).

Equation (3)
$$T = A + \frac{B \times \Delta Vbe}{Vbe + g \times \Delta Vbe} \tag{3}$$

-continued

Equation (4)

$$T = A + \frac{B \times \Delta Vbe/Vbe}{1 + g \times \Delta Vbe/Vbe} \quad (4)$$

Wherein A, B, and g are constants in Equation (3) and Equation (4). In Equation (3), Vbe is a value that decreases with temperature rise. ΔVbe is a value that increases with temperature rise. The denominator of Equation (3) can accordingly be made constant by setting an appropriate value for coefficient g. Moreover, ΔVbe is proportional to the absolute temperature, and so making denominator of Equation (3) constant with temperature means that the fraction of Equation (3) is proportional to absolute temperature. Thus setting appropriate values for the constants A, B, g in Equation (3) to enable the temperature measurement value T to be obtained. The optimum constants A, B, g may be set in Equation (3) in consideration of the linearity of temperature conversion, and it is not always necessary to make the denominator constant with temperature.

Equation (4) is a modified version of Equation (3). The digital value output from the AD converter 30 is the ratio of the measured voltage (the voltage difference between the positive side input terminal 31 and the negative side input terminal 32) to the voltage input to the reference voltage input terminal 33. Thus in the connection state illustrated in FIG. 5, the digital value output from the AD converter 30 is equivalent to ΔVbe/Vbe. Namely, applying the output value of the AD converter 30 to ΔVbe/Vbe in Equation (4) enables the temperature measurement value T to be obtained. The temperature measurement value T is thereby obtainable by employing a digital value output from the AD converter 30 equivalent to ΔVbe/Vbe, and performing the computation of Equation (4) in the digital operation section 40.

The following are examples of causes of deterioration in precision of the temperature measurement value T in the temperature measurement device 10.

[1] mismatch between the transistors Q1 and Q2 of the sensor 20
[2] mismatch between the resistor elements R1 and R2 of the sensor 20
[3] mismatch between the transistors M1 and M2 of the sensor 20
[4] offset of the AD converter 30
[5] mismatch between the transistors Q3 and Q4 of the current source 50
[6] mismatch between the resistor elements R3 and R4 of the current source 50
[7] offset of the operational amplifier 53 of the current source 50

In order to obtain a high precision temperature measurement value T, ideally the pair of transistors Q1 and Q2 in the sensor 20 have equivalent inter-base-emitter voltages when current of the same magnitude flows therein. The mismatch between the transistors Q1 and Q2 in [1] means there is a difference in current characteristics of the inter-base-emitter voltage between the transistors Q1 and Q2.

In order to obtain a high precision temperature measurement value T, ideally the resistance values of the resistor elements R1 and R2 of the sensor 20 are equivalent to each other. A mismatch between the resistor elements R1 and R2 in [2] means there is a difference between the resistance value of the resistor element R1 and the resistance value of the resistor element R2.

In order to obtain a high precision temperature measurement value T, ideally a current ratio between the current I1 output from the transistor M1 of the sensor 20 and the current I2 output from the transistor M2 of the sensor 20 is a set current ratio (1:N). The mismatch between the transistor M1 and the transistor M2 in [3] means that there is deviation of the current ratio between current I1 and current I2 from the set current ratio (1:N).

In order to obtain a high precision temperature measurement value T, ideally the AD converter 30 has no offset. The offset of the AD converter 30 in [4] is a digital value output from the AD converter 30 when the voltage difference between the positive side input terminal 31 and the negative side input terminal 32 is zero.

In order to obtain a high precision temperature measurement value T, the current values of the currents I1 and I2 in the sensor 20 are preferably controlled to a specific magnitude. Thus the pair of transistors Q3 and Q4 of the current source 50 ideally have equivalent inter-base-emitter voltages when current of the same magnitude flows therein. A mismatch between the transistors Q3 and Q4 in [5] means there is a difference between the current characteristics of the inter-base-emitter voltages of the transistors Q3 and Q4.

In order to secure precision in the current values of the current I1 and I2 of the sensor 20, the resistance values of the resistor elements R3 and R4 of the current source 50 are ideally equivalent to each other. A mismatch between the resistor elements R3 and R4 in [6] means there is a difference between the resistance value of the resistor R3 and the resistance value of the resistor R4.

In order to secure precision in the current values of the current I1 and I2 of the sensor 20, ideally there is no offset in the operational amplifier 53. The offset of the operational amplifier 53 in [7] is the output voltage output from the operational amplifier 53 when the voltage difference between the inverting input terminal 57 and the non-inverting input terminal 58 is zero.

In the temperature measurement device 10 the errors in the temperature measurement value T caused by causes [1] to [7] are reduced in the following manner.

Measures to Address Mismatch Between the Transistors Q1, Q2 and the Resistor Elements R1 and R2

The temperature measurement device 10 performs the following processing to reduce errors arising in the temperature measurement value T due to cause [1] and cause [2].

The temperature measurement device 10 measures the ΔVbe in a first sensing state in which the current I1 is being supplied to the resistor element R1 and the transistor Q1, and the current I2 is being supplied to the resistor element R2 and the transistor Q2. In the first sensing state, the current I1 flows in the forward direction with respect to the pn junction of the transistor Q1, and the current I2 flows in the forward direction with respect to the pn junction of the transistor Q2. The temperature measurement device 10 also measures the ΔVbe in the second sensing state in which the current I1 is supplied to the resistor element R2 and the transistor Q2 and the current I2 is supplied to the resistor element R1 and the transistor Q1. In the second sensing state, the current I1 flows in the forward direction with respect to the pn junction of the transistor Q2, and the current I2 flows in the forward direction with respect to the pn junction of the transistor Q1. The ΔVbe is the difference between the forward direction voltage at the pn junction of the transistor Q1 (the inter-base-emitter voltage, the voltage at node n5) and the forward direction voltage at the pn junction of the transistor Q2 (the inter-base-emitter voltage, the voltage at node n6).

The temperature measurement device 10 computes the temperature measurement value T based on the average value of the ΔVbe measured under the first sensing state and the ΔVbe measured under the second sensing state. Taking the average of the value of each of the ΔVbe obtained by switching over the supply destination of the current I1 and I2 in this manner enables error in the temperature measurement value T caused by mismatch between the transistors Q1 and Q2 and mismatch between the resistor elements R1 and R2 to be reduced.

Measures to Address Mismatch Between the Transistors M1 and M2

The temperature measurement device 10 performs the following processing to reduce errors arising in the temperature measurement value T due to cause [3]. The temperature measurement device 10 measures the voltages across the two ends of the resistor elements R1 and R2 in both the first sensing state and the second sensing state. The temperature measurement device 10 then computes an average value C (ave) of the current ratio C (=i2/i1) between the current I1 (current value i1) and current I2 (current value i2) based on the voltages across the two ends of the resistor elements R1 and R2 in each of the states of the first sensing state and the second sensing state. ΔVbe may be approximated here using the characteristic of the pn junction in the following Equation (5).

Equation (5)

$$\Delta Vbe = \frac{k_a T_a}{q} \log\left(\frac{i2}{i1}\right) = \frac{k_B T_a}{q} \log(C) \quad (5)$$

In Equation (5), $k_B$ is the Boltzmann constant, $T_a$ (K) is the absolute temperature, and q is the elementary charge. The following Equation (6) is obtained, wherein ΔVbe and C are denoted ΔVbeo and Co, respectively, when there is no mismatch between the transistors M1 and M2.

Equation (6)

$$\Delta Vbeo = \frac{k_B T_a}{q} \log(Co) \quad (6)$$

ΔVbeo in Equation (5) and Equation (6) can be expressed by the following Equation (7).

Equation (7)

$$\Delta Vbeo = \Delta Vbe \frac{\log(Co)}{\log(C)} \quad (7)$$

Namely, the effect of any mismatch between the transistors M1 and M2 is reduced by multiplying a correction coefficient K (=log (Co)/log (C)) by the measured ΔVbe. Note that Co in the Equation (6) and the Equation (7) is a value equivalent to the design value of current ratio (1:N) between the current I1 and I2. The temperature measurement device 10 computes the correction coefficient K (=log (Co)/log (C(ave))) from the value C (ave) computed based on the potential across the two terminals of resistor elements R1 and R2. The temperature measurement device 10 computes ΔVbeo in which the effect of mismatch between the transistors M1 and M2 is reduced by correcting the measured ΔVbe using the correction coefficient K. The temperature measurement device 10 then computes the temperature measurement value T based on the ΔVbeo.

Measures to Address Offset of the AD Converter 30

An AD conversion value corresponding to the voltage difference between the node n5 and the node n6 in the first sensing state (ΔVbe) is denoted D1, and the AD conversion value corresponding to the voltage difference between the node n5 and the node n6 in the second sensing state (ΔVbe) is denoted D2. The AD conversion value corresponding to the offset voltage of the AD converter 30 is denoted $D_{OFFSET}$. The AD conversion value corresponding to the measurement value of the voltage difference between the node n5 and the node n6 (ΔVbe) in the first sensing state and including the offset voltage of the AD converter 30 is denoted $D_{1S}$. The AD conversion value corresponding to the measurement value of the voltage difference between the node n5 and the node n6 (ΔVbe) in the second sensing state and including the offset voltage of the AD converter 30 is denoted $D_{2S}$. Accordingly, the following Equations (8) to (10) are yielded.

$$D_{1S} = D_1 + D_{OFFSET} \quad (8)$$

Equation (8)

$$D_{2S} = D_2 + D_{OFFSET} \quad (9)$$

Equation (9)

$$D_1 = -D_2 \quad (10)$$

Equation (10)

In Equation (10), causes of deterioration in precision other than the offset of the AD converter 30 are ignored for explanatory purposes. The following Equation (11) can be obtained from Equations (8) to (10).

$$D_{1S} - D_{2S} = D_1 + D_{OFFSET} - (D_2 + D_{OFFSET}) = D_1 - D_2 = 2D_1 \quad (11)$$

Equation (11)

Equation (11) implies that the offset voltage of the AD converter 30 can be eliminated by acquiring an AD conversion value $D_{1S}$ acquired in the first sensing state with opposite polarity to the AD conversion value $D_{2S}$ acquired in the second sensing state.

The temperature measurement device 10 accordingly performs the following processing to reduce the error in the temperature measurement value T caused by cause [4]. The temperature measurement device 10 switches the connections to the positive side input terminal 31 and the negative side input terminal 32 of the AD converter 30 using the second connection switching section 22 such that the polarities of the ΔVbe measured in each of the states of the first sensing state and the second sensing state are the opposite of each other.

Measures to Address Mismatch Between the Transistors Q3, Q4, and the Resistor Elements R3, R4

In order to reduce the error in the temperature measurement value T caused by cause [5] and cause [6], the temperature measurement device 10 performs the following processing. The temperature measurement device 10 measures the ΔVbe in the first current control state, in which the current I3 is supplied to the resistor element R3 and the transistor Q3 and the current I4 is supplied to the resistor element R4 and the transistor Q4. The temperature measurement device 10 also measures the ΔVbe in the second current control state in which the current I3 is supplied to the resistor element R4 and the transistor Q4, and the current I4 is supplied to the resistor element R3 and the transistor Q3. In the temperature measurement device 10 the transition in state between the first current control state and the second current control state is performed by the third connection switching section 51. The temperature measurement device 10 computes the temperature measurement value T based on the average value of the ΔVbe measured under each of the states of the first current control state and the second current control state. This thereby enables errors in the temperature measurement value T caused by the mismatch between the transistors Q3 and Q4 and the mismatch between the resistor elements R3 and R4 to be reduced by taking the average value of each of the values of ΔVbe obtained under each of the current control states in which the supply destination of the currents I3 and I4 are switched.

Measures to Address the Offset of the Operational Amplifier 53

The temperature measurement device 10 performs the following processing in order to reduce errors in the temperature measurement value T caused by cause [7]. The temperature measurement device 10, along with transitioning states between the first current control state and the second current control state, also switches the nodes connected to the inverting input terminal 57 and the non-inverting input terminal 58 of the operational amplifier 53. Namely, the temperature measurement device 10 connects the node positioned symmetrically to the node connected to the inverting input terminal 57 in the first current control state to the non-inverting input terminal 58 in the second current control state. The temperature measurement device 10 also connects the node positioned symmetrically to the node connected to the non-inverting input terminal 58 in the first current control state to the inverting input terminal 57 in the second current control state. Switching over the nodes connected to the inverting input terminal 57 and the non-inverting input terminal 58 is performed in the temperature measurement device 10 by the fourth connection switching section 52.

The temperature measurement device 10 also, along with transitioning states between the first current control state and the second current control state, switches the phase of the output voltage of the operational amplifier 53 between in-phase and out-of-phase with respect to the non-inverting input terminal 58. Switching the input and output of the operational amplifier 53 as described above at the same time as transitioning states between the first current control state and the second current control state makes the operation of the current source 50 overall equivalent in each of the states. In the temperature measurement device 10 switching of the phase of the output voltage between in-phase and out-of-phase with respect to the non-inverting input terminal 58 is performed by the fifth connection switching section 56.

In the temperature measurement device 10, accompanying switching of the input and output of the operational amplifier 53 as described above, the temperature measurement value T is computed based on the average value of the measured ΔVbe under each state of the first current control state and the second current control state. This thereby enables a reduction in the error in temperature measurement value T caused by offset of the operation amplifier 53.

Figure 6:
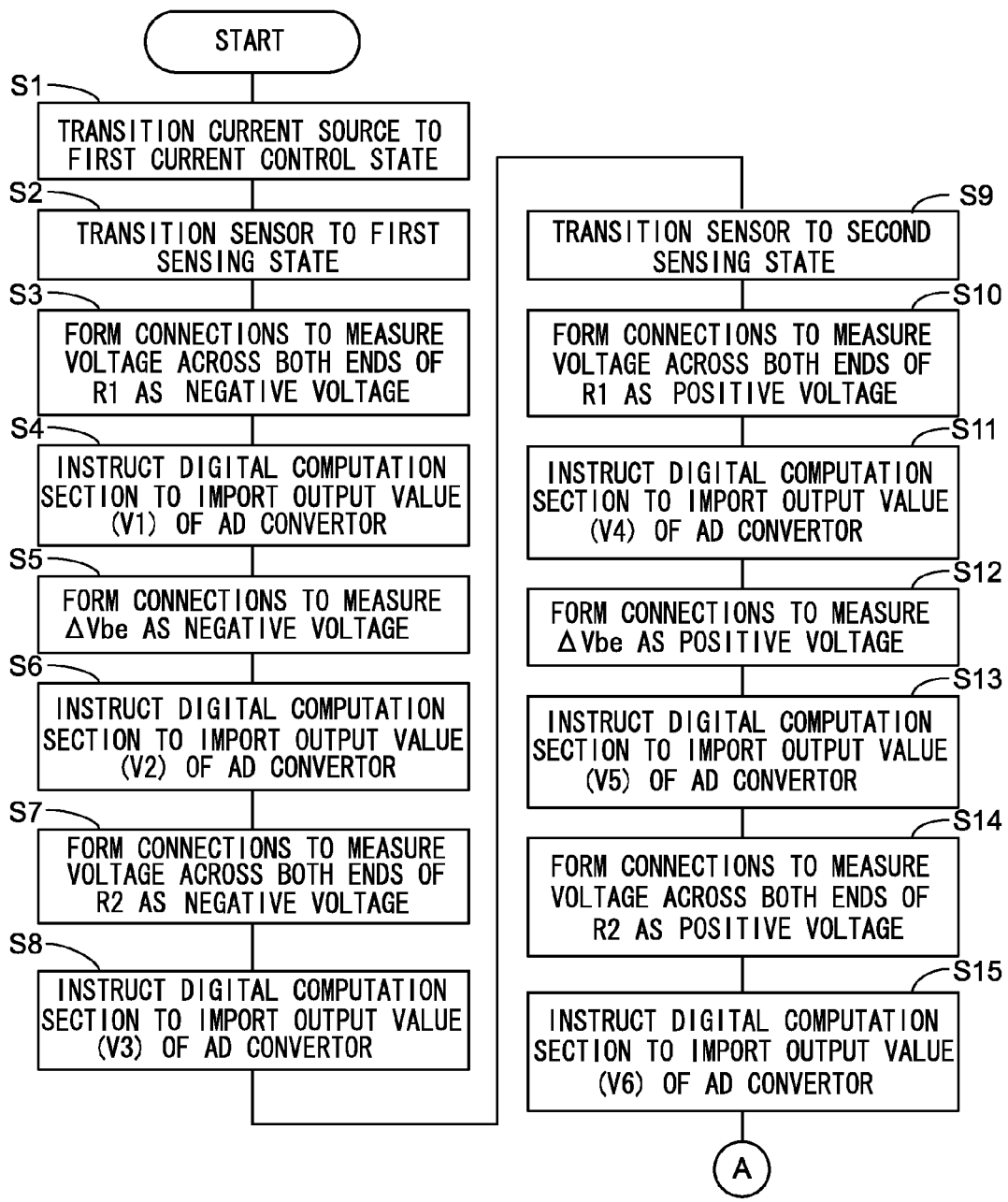
FIG. 6 is a flowchart illustrating a flow of processing in a measurement control program according to an exemplary embodiment of technology disclosed herein.
Figure 7:
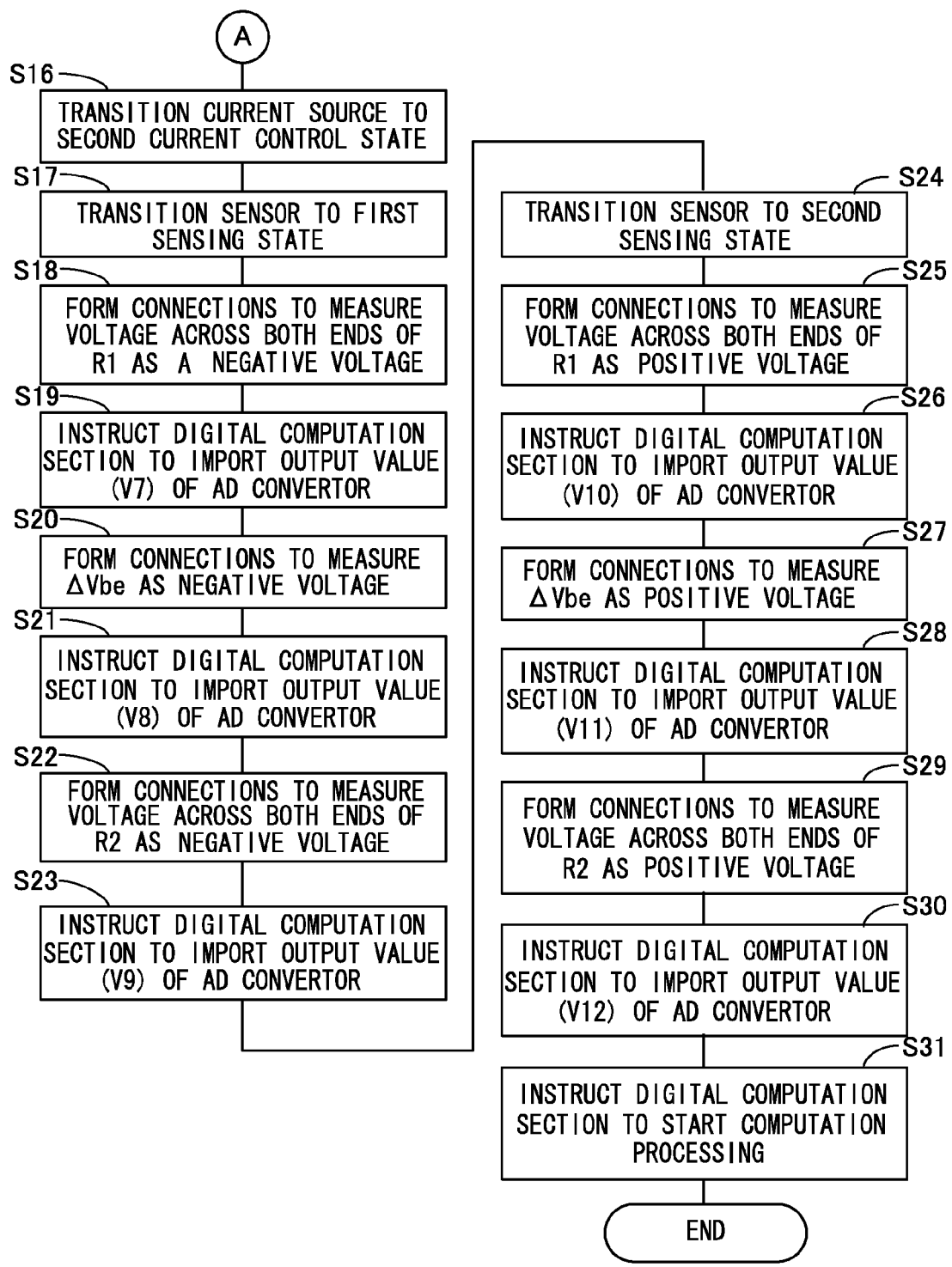
FIG. 7 is a flowchart illustrating processing in a measurement control program according to an exemplary embodiment of technology disclosed herein.

Explanation next follows regarding operation of the temperature measurement device 10. FIG. 6 and FIG. 7 are flowcharts illustrating a flow of measurement control processing implemented by the CPU 61 of the controller 60 executing the measurement control program 64 (see FIG. 4) stored in the ROM 63.

At step S1, the CPU 61 of the controller 60 transitions the current source 50 to the first current control state by supplying the control signals C5 to C7 to the respective third to fifth connection switching sections 51, 52, 56 of the current source 50.

Figure 8:
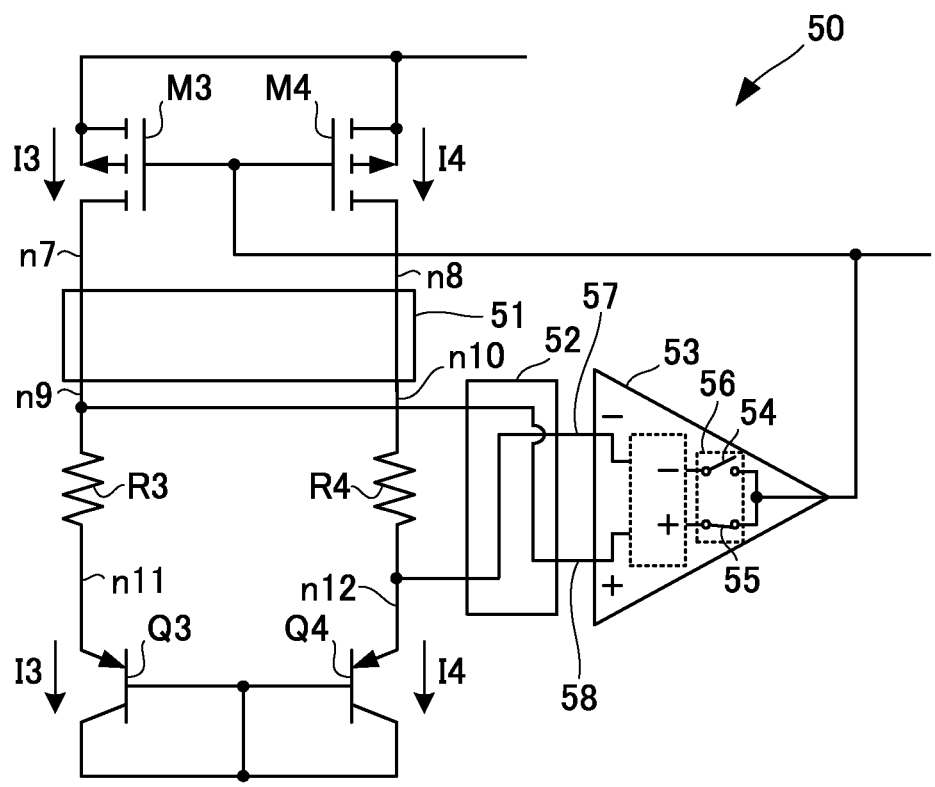
FIG. 8 is a block diagram illustrating an example of a connection configuration of a temperature measurement device according to an exemplary embodiment of technology disclosed herein.

FIG. 8 is a circuit block diagram illustrating a connection state of the current source 50 in the first current control state. In the first current control state, the third connection switch 51 connects the node n7 to the node n9, and connects the node n8 to the node n10. The fourth connection switching section 52 connects the node n9 to the non-inverting input terminal 58 of the operational amplifier 53, and connects the node n12 to the inverting input terminal 57 of the operational amplifier 53. The fifth connection switching section 56 places the switch 55 in an ON state and the switch 54 in an OFF state so as to output the output voltage of the operational amplifier 53 in-phase with respect to the non-inverting input terminal 58.

Due to forming the above connections in the first current control state, the current I3 output from the transistor M3 flows in the resistor element R3 and the transistor Q3, and the current I4 output from the transistor M4 flows in the resistor element R4 and the transistor Q4. The current value I3 flows in the forward direction with respect to the pn junction of the transistor Q3, and the current I4 flows in the forward direction with respect to the pn junction of the transistor Q4. The operational amplifier 53 outputs the control voltage Vamp that controls the magnitudes of each of the current values of the currents I1 to I4 to correspond to the difference between the forward direction voltage in the pn junction of the transistor Q3 and the forward direction voltage in the pn junction of the transistor Q4 in-phase with respect to the non-inverting input terminal 58. Each of the current values of the currents I1 to I4 is thereby controlled to as to be constant, and not to depend on the voltage of the power source line P. Namely, the currents I1 to I4 become currents that do not depend on the power source voltage.

At step S2, the CPU 61 of the controller 60 transitions the sensor 20 to the first sensing state by supplying the control signal C1 to the first connection switching section 21 of the sensor 20.

At step S3, the CPU 61 of the controller 60 forms connections to measure the voltage across the two ends of the resistor element R1 as a negative voltage in the AD converter 30 by supplying the control signal C2 to the second connection switching section 22 of the sensor 20.

Figure 9:
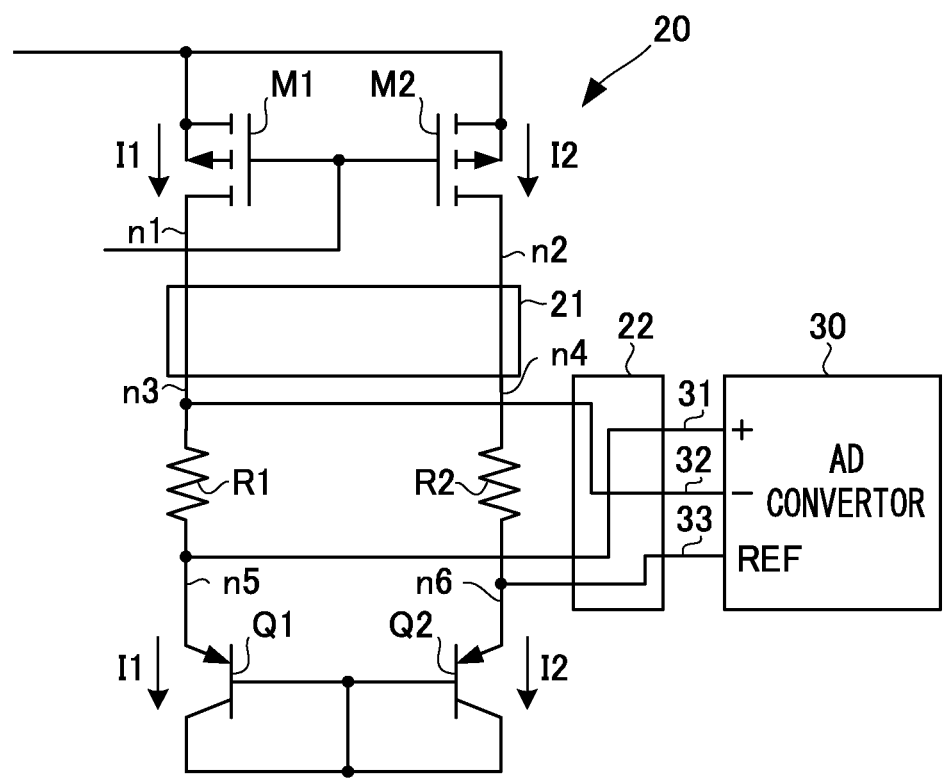
FIG. 9 is a block diagram illustrating an example of a connection configuration of a temperature measurement device according to an exemplary embodiment of technology disclosed herein.

FIG. 9 is a circuit block diagram illustrating a connected state in the first sensing state, in which the voltage across the two ends of the resistor element R1 is measured as a negative voltage in the AD converter 30. The first connection switching section 21 connects the node n1 to the node n3, and the node n2 to the node n4 when the sensor 20 is in the first sensing state. This thereby enables the current I1 output from the transistor M1 to flow in the resistor element R1 and the transistor Q1, and the current I2 output from the transistor M2 to flow in the resistor element R2 and the transistor Q2. The current I1 flows in the forward direction with respect to the pn junction of the transistor Q1, and the current I2 flows in the forward direction with respect to the pn junction of the transistor Q2.

The second connection switching section 22 connects the node n5 to the positive side input terminal 31 of the AD converter 30, and connects the node n3 to the negative side input terminal 32 of the AD converter 30 when the voltage across the two ends of the resistor element R1 is measured as a negative voltage in the AD converter 30. In the first sensing state, out of the node n5 and the node n6, the second connection switching section 22 connects the node n6 in which the current I2 is flowing to the reference voltage input terminal 33 of the AD converter 30.

At step S4, output from the AD converter 30 is effected by the CPU 61 of the controller 60 supplying the control signal C3 to the AD converter 30. The AD converter 30 thereby outputs the negative digital value V1 corresponding to the voltage across the two ends of the resistor element R1. Then import of the digital value V1 output from the AD converter 30 is instructed by the CPU 61 of the controller 60 by supplying the control signal C4 to the digital operation section 40. The digital operation section 40 thereby stores the digital value V1 output from the AD converter 30 in its own register 42.

At step S5, the CPU 61 of the controller 60 forms connections to measure the voltage difference, ΔVbe, between the nodes n5 and n6 as a negative voltage in the AD converter 30 by supplying the control signal C2 to the second connection switching section 22 of the sensor 20. The ΔVbe is the difference between the forward direction voltage in the pn junction of the transistor Q1 (inter-base-emitter voltage), and the forward direction voltage in the pn junction of the transistor Q2 (inter-base-emitter voltage).

Figure 10:
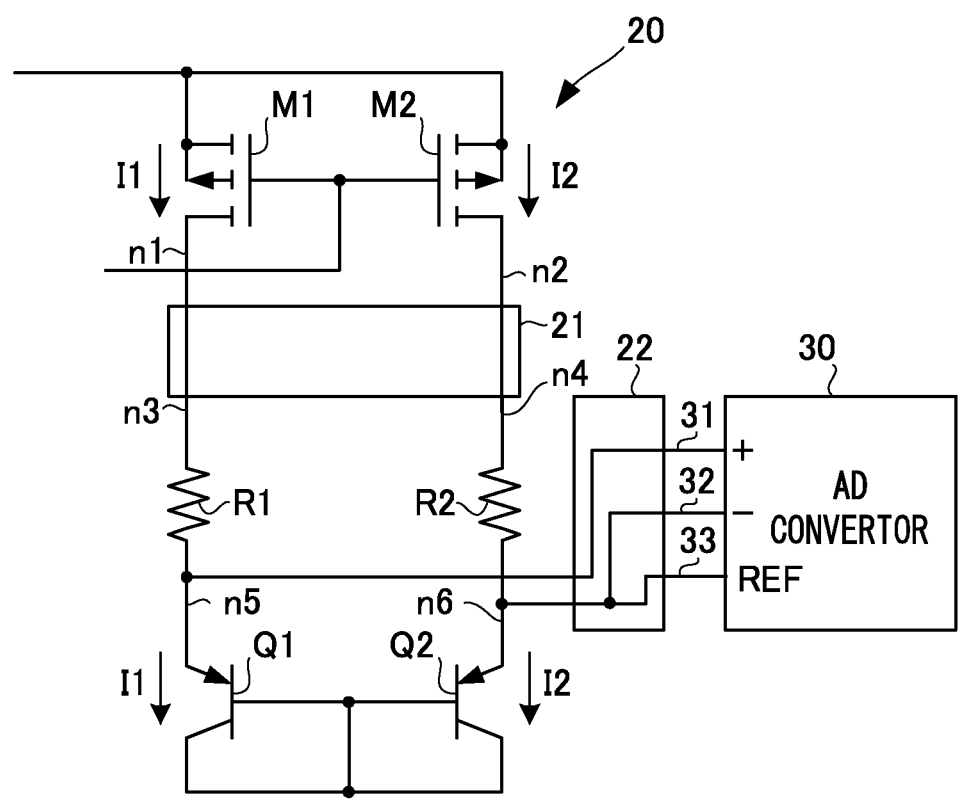
FIG. 10 is a block diagram illustrating an example of a connection configuration of a temperature measurement device according to an exemplary embodiment of technology disclosed herein.

FIG. 10 is a circuit block diagram illustrating the connection state in the first sensing state, in which ΔVbe is measured as a negative voltage in the AD converter 30. The second connection switching section 22 connects the node n5 to the positive side input terminal 31 of the AD converter 30, and the node n6 to the negative side input terminal 32 of the AD converter 30 when the ΔVbe is being measured as a negative voltage in the AD converter 30 in the first sensing state. The node n6 is maintained in a connected state to the reference voltage input terminal 33 of the AD converter 30.

At step S6, output from the AD converter 30 is effected by the CPU 61 of the controller 60 supplying the control signal C3 to the AD converter 30. The AD converter 30 thereby outputs the negative digital value V2 corresponding to the ΔVbe. Then import of the digital value V2 output from the AD converter 30 is instructed by the CPU 61 of the controller 60 by supplying the control signal C4 to the digital operation section 40. The digital operation section 40 thereby stores the digital value V2 output from the AD converter 30 in its own register 42.

At step S7, the CPU 61 of the controller 60 forms connections to measure the voltage across the two ends of the resistor element R2 as a negative voltage in the AD converter 30 by supplying the control signal C2 to the second connection switching section 22 of the sensor 20.

Figure 11:
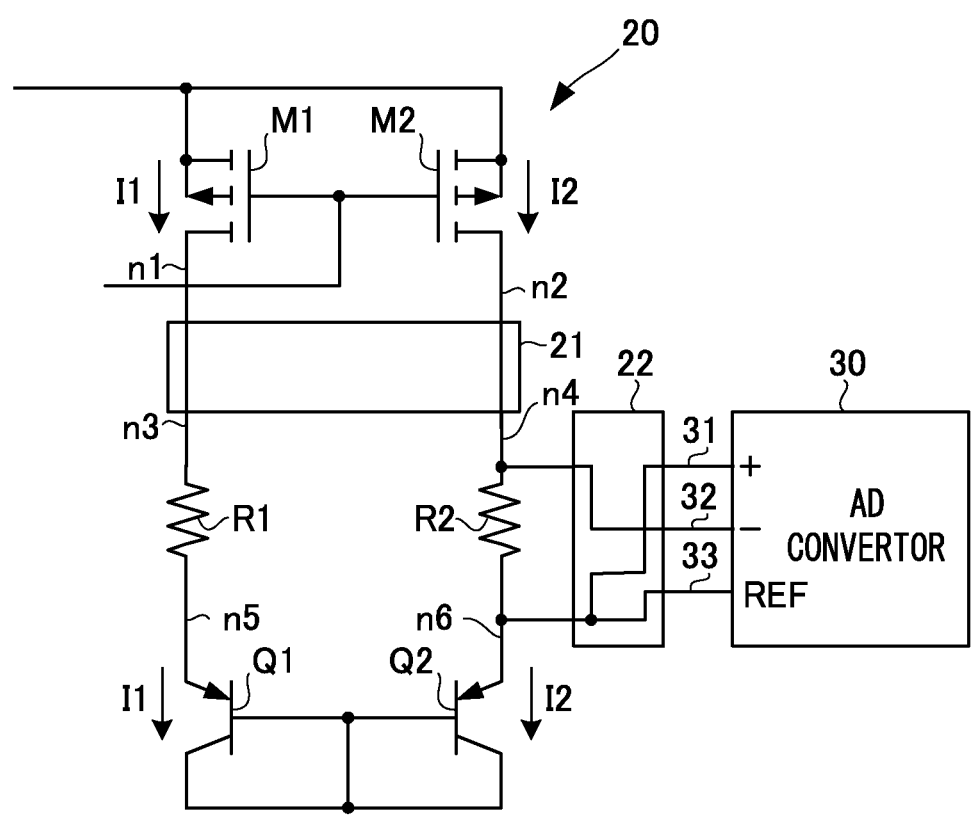
FIG. 11 is a block diagram illustrating an example of a connection configuration of a temperature measurement device according to an exemplary embodiment of technology disclosed herein.

FIG. 11 is a circuit block diagram illustrating a connection state in the first sensing state when measuring the voltage across the two ends of the resistor element R2 as a negative voltage in the AD converter 30. When measuring the voltage across the two ends of the resistor element R2 as a negative voltage in the AD converter 30, the second connection switching section 22 connects the node n6 to the positive side input terminal 31 of the AD converter 30, and connects the node n4 to the negative side input terminal 32 of the AD converter 30. The node n6 is maintained in a connected state to the reference voltage input terminal 33 of the AD converter 30.

At step S8, output of the AD converter 30 is effected by the CPU 61 of the controller 60 supplying the control signal C3 to the AD converter 30. The AD converter 30 thereby outputs the negative digital value V3 corresponding to the voltage across the two ends of the resistor element R2. Then the CPU 61 of the controller 60 instructs import of the digital value V3 output from the AD converter 30 by supplying the control signal C4 to the digital operation section 40. The digital operation section 40 thereby stores the digital value V3 output from the AD converter 30 in its own register 42.

At step S9, the CPU 61 of the controller 60 transitions the sensor 20 to the second sensing state by supplying the control signal C1 to the first connection switching section 21 of the sensor 20.

At step S10, the CPU 61 of the controller 60 forms connections to measure the voltage across the two ends of the resistor element R1 as a positive voltage in the AD converter 30 by supplying the control signal C2 to the second connection switching section 22 of the sensor 20.

Figure 12:
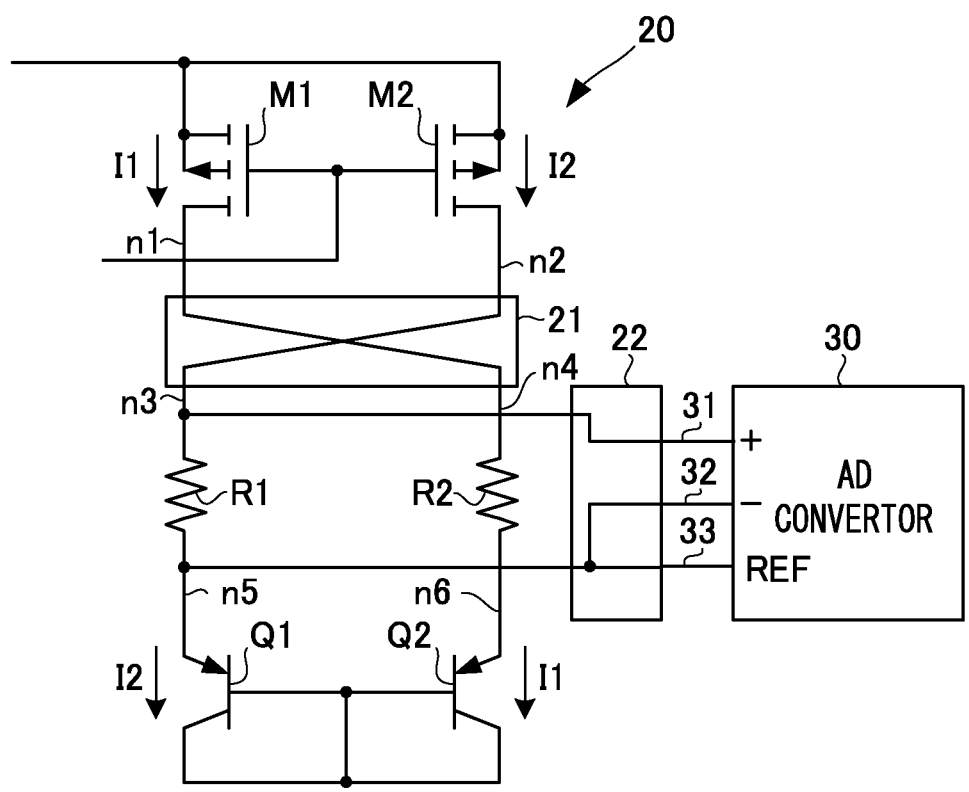
FIG. 12 is a block diagram illustrating an example of a connection configuration of a temperature measurement device according to an exemplary embodiment of technology disclosed herein.

FIG. 12 is a circuit block diagram illustrating a connection state when measuring the voltage across the two ends of the resistor element R1 as a positive voltage in the AD converter 30 in the second sensing state. When adopting the second sensing state of the sensor 20, the first connection switching section 21 connects the node n1 to the node n4, and connects the node n2 to the node n3. The current I1 output from the transistor M1 thereby flows in the resistor element R2 and the transistor Q2, and the current I2 output from the transistor M2 flows in the resistor element R1 and the transistor Q1.

The current I1 flows in the forward direction with respect to the pn junction of the transistor Q2, and the current I2 flows in the forward direction with respect to the pn junction of the transistor Q1.

When measuring the voltage across the two ends of the resistor element R1 as a positive voltage in the AD converter 30, the second connection switching section 22 connects the node n3 to the positive side input terminal 31 of the AD converter 30 and connects the node n5 to the negative side input terminal 32 of the AD converter 30. In the second sensing state, out of the node n5 and the node n6, the second connection switching section 22 connects the node n5 in which the current I2 flows to the reference voltage input terminal 33 of the AD converter 30.

At step S11, output of the AD converter 30 is effected by the CPU 61 of the controller 60 supplying the control signal C3 to the AD converter 30. The AD converter 30 thereby outputs the positive digital value V4 corresponding to the voltage across the two ends of the resistor element R1. Then the CPU 61 of the controller 60 instructs import of the digital value V4 output from the AD converter 30 by supplying the control signal C4 to the digital operation section 40. The digital operation section 40 thereby stores the digital value V4 output from the AD converter 30 in its own register 42.

At step S12, the CPU 61 of the controller 60 forms connections to measure the voltage difference between the node n5 and the node n6, ΔVbe, as a positive voltage in the AD converter 30 by supplying the control signal C2 to the second connection switching section 22 of the sensor 20. The ΔVbe is the difference between the forward direction voltage (the inter-base-emitter voltage) in the pn junction of the transistor Q1 and the forward direction voltage (the inter-base-emitter voltage) in the pn junction of the transistor Q2.

Figure 13:
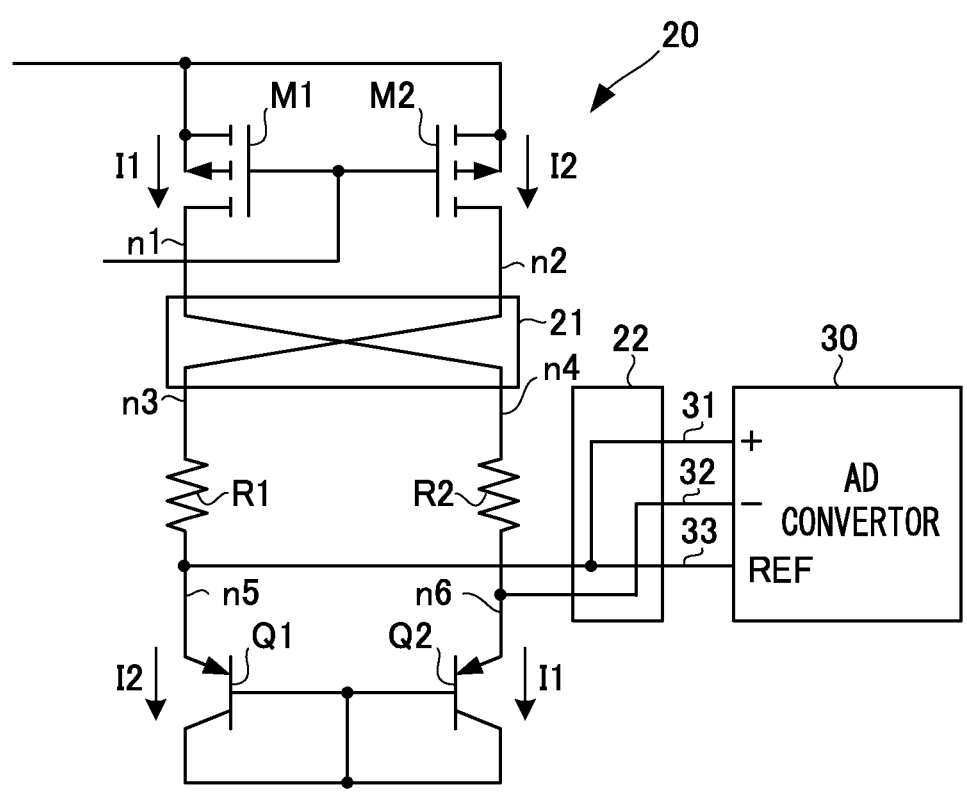
FIG. 13 is a block diagram illustrating an example of a connection configuration of a temperature measurement device according to an exemplary embodiment of technology disclosed herein.

FIG. 13 is a circuit block diagram illustrating a connection state when measuring the ΔVbe as a positive voltage in the AD converter 30 in the second sensing state. When measuring the ΔVbe as a positive voltage in the AD converter 30 in the second sensing state, the second connection switching section 22 connects the node n5 to the positive side input terminal 31 of the AD converter 30, and connects the node n6 to the negative side input terminal 32 of the AD converter 30. The node n5 is maintained in a connected state to the reference voltage input terminal 33 of the AD converter 30.

At step S13, output from the AD converter 30 is effected by the CPU 61 of the controller 60 supplying the control signal C3 to the AD converter 30. The AD converter 30 thereby outputs the positive digital value V5 corresponding to the ΔVbe. Then the CPU 61 of the controller 60 instructs import of the digital value V5 output from the AD converter 30 by supplying the control signal C4 to the digital operation section 40. The digital operation section 40 thereby stores the digital value V5 output from the AD converter 30 in its own register 42.

At step S14, the CPU 61 of the controller 60 forms connections for measuring the voltage across the two ends of the resistor element R2 as a positive voltage in the AD converter 30 by supplying the control signal C2 to the second connection switching section 22 of the sensor 20.

Figure 14:
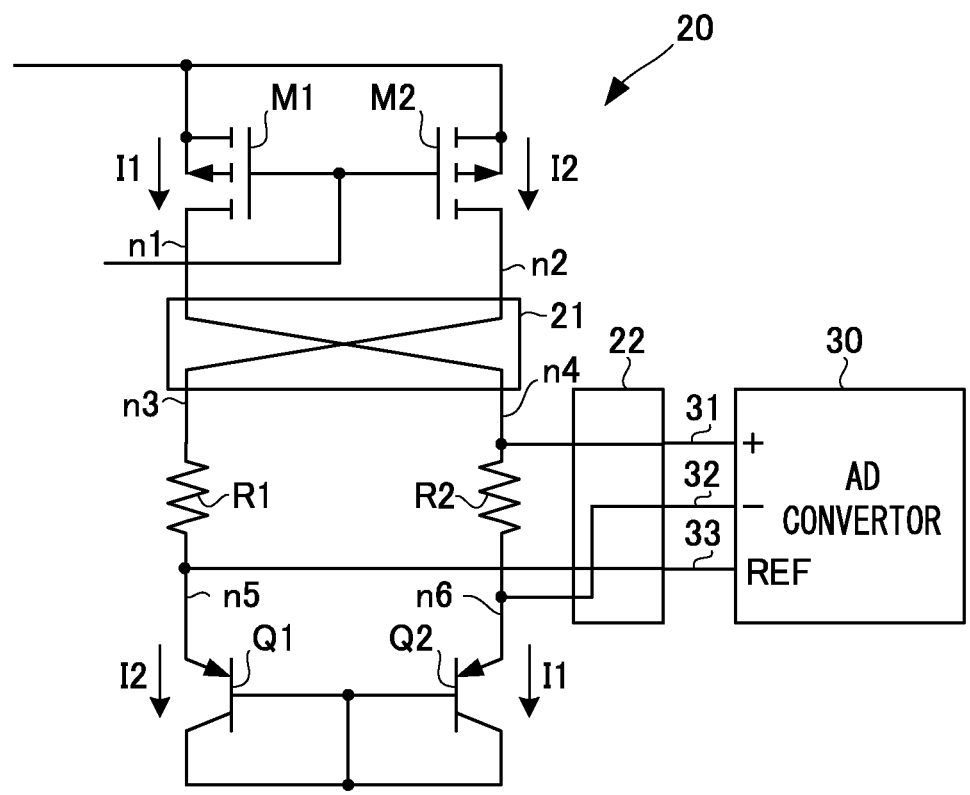
FIG. 14 is a block diagram illustrating an example of a connection configuration of a temperature measurement device according to an exemplary embodiment of technology disclosed herein.

FIG. 14 is a circuit block diagram illustrating a connection state when measuring the voltage across the two ends of the resistor element R2 as a positive voltage in the AD converter 30 in the second sensing state. When measuring the voltage across the two ends of the resistor element R2 as a positive voltage in the AD converter 30, the second connection switching section 22 connects the node n4 to the positive side input terminal 31 of the AD converter 30, and connects the node n6 to the negative side input terminal 32 of the AD converter 30. The node n5 is maintained in a connected state to the reference voltage input terminal 33 of the AD converter 30.

At step S15, output from the AD converter 30 is effected by the CPU 61 of the controller 60 supplying the control signal C3 to the AD converter 30. The AD converter 30 thereby outputs the positive digital value V6 corresponding to the voltage across the two ends of the resistor element R2. Then the CPU 61 of the controller 60 instructs import of the digital value V6 output from the AD converter 30 by supplying the control signal C4 to the digital operation section 40. The digital operation section 40 thereby stores the digital value V6 output from the AD converter 30 in its own register 42.

At step S16, the CPU 61 of the controller 60 transitions the current source 50 to the second current control state by supplying the respective control signals C5 to C7 to the third to the fifth connection switching sections 51, 52, 56 of the current source 50.

Figure 15:
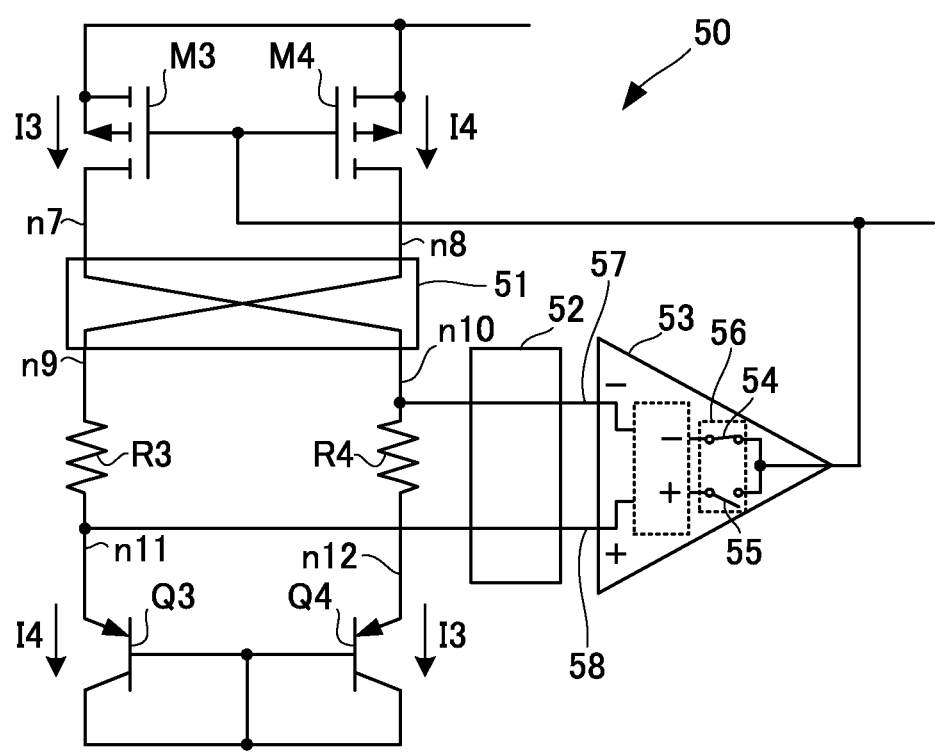
FIG. 15 is a block diagram illustrating an example of a connection configuration of a temperature measurement device according to an exemplary embodiment of technology disclosed herein.

FIG. 15 is a circuit block diagram illustrating a connection state of the current source 50 in the second current control state. In the second current control state, the third connection switching section 51 connects the node n7 to the node n10, and connects the node n8 to the node n9. The fourth connection switching section 52 connects the node n11 that is positioned symmetrically to the node n12 connected to the inverting input terminal 57 in the first current control state, to the non-inverting input terminal 58 in the second current control state. The fourth connection switching section 52 connects the node n10 that is positioned symmetrically to the node n9 connected to the non-inverting input terminal 58 in the first current control state to the inverting input terminal 57 in the second current control state. The fifth connection switching section 56 places the switch 54 in the ON state, and places the switch 55 in the OFF state in order to output the output voltage of the operational amplifier 53 out-of-phase with respect to the non-inverting input terminal 58.

Due to forming the connections as described above in the second current control state, the current I3 output from the second transistor M3 flows in the resistor element R4 and the transistor Q4, and the current I4 output from the transistor M4 thereby flows in the resistor element R3 and the transistor Q3. The current I3 flows in the forward direction with respect to the pn junction of the transistor Q4, and the current I4 flows in the forward direction with respect to the pn junction of the transistor Q3. The operational amplifier 53 outputs the control voltage Vamp that controls the magnitude of each of the current values of the currents I1 to I4 to correspond to the difference between the forward direction voltage in the pn junction of the transistor Q3 and the forward direction voltage in the pn junction of the transistor Q4 out-of-phase with respect to the non-inverting input terminal 58. Each of the current values of the currents I1 to I4 is thereby controlled to as to be constant, and not to depend on the voltage of the power source line P. Namely, the currents I1 to I4 are currents that do not have a source voltage dependency.

The processing of each of the steps S17 to S30 is similar to the processing of each of the steps S2 to S15 described above, and so detailed explanation thereof will be omitted. The negative digital value V7 corresponding to the voltage across the two ends of the resistor element R1 measured under the first sensing state is stored in the register 42 of the digital operation section 40 by executing the processing of step S19. The negative digital value V8 corresponding to the ΔVbe measured under the first sensing state is stored in the register 42 of the digital operation section 40 by executing the processing of step S21. The negative digital value V9 corresponding to the voltage across the two ends of the resistor element R2 measured under the first sensing state is stored in the register 42 of the digital operation section 40 by executing the processing of step S23. The positive digital value V10 corresponding to the voltage across the two ends of the resistor element R1 measured under the second sensing state is stored in the register 42 of the digital operation section 40 by executing the processing of step S26. The positive digital value V11 corresponding to the ΔVbe measured under the second sensing state is stored in the register 42 of the digital operation section 40 by executing the processing of step S28. The positive digital value V12 corresponding to the voltage across the two ends of the resistor element R2 measured under the second sensing state is stored in the register 42 of the digital operation section 40 by executing the processing of step S30.

In step S31, start of the computation processing to compute the temperature measurement value T is instructed by the CPU 61 of the controller 60 supplying the control signal C4 to the digital operation section 40, then the present routine is ended. The sequence for acquiring the digital values V1 to V12 is not limited to the above sequence, and may be modified as appropriate.

FIG. 16 is a diagram illustrating correspondence relationships between states of the sensor 20 and the current source 50 in the above measurement control processing (see FIG. 6 and FIG. 7), and voltages measured in the AD converter 30 and digital values corresponding to these voltages. According to the measurement control processing above, when the current source 50 adopts the first current control state and the second current control state, the sensor 20 adopts the first sensing state and the second sensing state, respectively. The digital values V1 to V3 are acquired under the first current control state and the first sensing state, and the digital values V4 to V6 are acquired under the first current control state and the second sensing state. The digital values V7 to V9 are acquired under the second current control state and the first sensing state, and the digital values V10 to V12 are acquired under the second current control state and the second sensing state. The acquired digital values V1 to V12 are stored in the register 42 of the digital operation section 40.

The digital values V2 and V8 are examples of first digital values of technology disclosed herein. The digital values V5 and V11 are examples of second digital values of technology disclosed herein. The digital values V1 and V7 are examples of third digital values of technology disclosed herein. The digital values V3 and V9 are examples of fourth digital values of technology disclosed herein. The digital values V4 and V10 are examples of fifth digital values of technology disclosed herein. The digital values V6 and V12 are examples of sixth digital values of technology disclosed herein.

Figure 17:
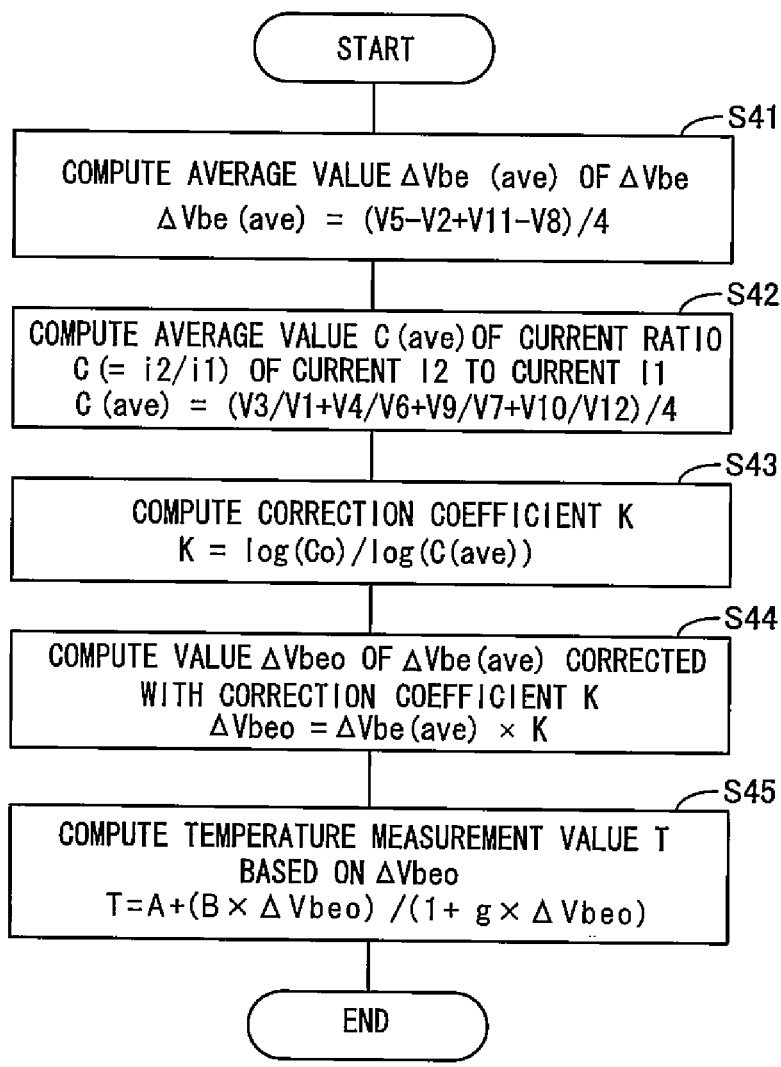
FIG. 17 is a flowchart illustrating a flow of processing in temperature computation program according to an exemplary embodiment of technology disclosed herein.

FIG. 17 is a flowchart illustrating a flow of temperature computation processing implemented by the CPU 41 of the digital operation section 40 executing the temperature computation program 44 (see FIG. 3) stored in the ROM 43. At step S31 of the above measurement control processing, the digital operation section 40 starts execution of the temperature computation program according to the control signal C4 supplied from the CPU 61 of the controller 60.

At step S41 in the above measurement control processing, the CPU 41 of the digital operation section 40 computes the average value, ΔVbe (aye), of the ΔVbe measured under the first and the second current control states, and the first and the second sensing states. Namely, the CPU 41 reads the digital values V2, V5, V8, and V11 corresponding to the ΔVbe stored in the register 42, and performs the computation processing represented by Equation (12) below.

$$\Delta Vbe(ave) = \frac{V5 - V2 + V11 - V8}{4} \quad (12)$$

Averaging the digital values V2 and V5 acquired under the first current control state, reduces the effects of the mismatch between the transistors Q1 and Q2 (cause [1]) and the mismatch between the resistor elements R1 and R2 (cause [2]) of the sensor. The effect of the offset of the AD converter 30 (cause [4]) is reduced since the digital values V2 and V5 are acquired so as to have mutually opposite polarities in the AD converter 30. Including the digital values V8 and V11, acquired under the second current control state, in the average reduces the effects of the mismatch between the transistors Q3 and Q4 (cause [5]), and the mismatch between the resistors R3 and R4 (cause [6]). Since switching between the first current control state and the second current control state accompanies the switching of the input/output in the operational amplifier 53, the effect of the offset of the operational amplifier 53 (cause [7]) is reduced.

At step S42, the CPU 41 of the digital operation section 40 computes the average value C (ave) of the current ratio C (=i2/i1) between the current I1 (current value i1) and the current I2 (current value i2) in the sensor 20. Namely, the CPU 41 reads the digital values V1, V3, V4, V6, V7, V9, V10, and V12 corresponding to the voltage across both ends of the resistor element R1 and the resistor element R2 stored in the register 42, and performs computation processing according to Equation (13) below.

$$C(ave) = \frac{V3/V1 + V4/V6 + V9/V7 + V10/V12}{4} \quad (13)$$

The digital values V1, V6, V7, and V12 are values proportional to the current value i1 of the current I1, and the digital values V3, V4, V9, and V10 are values proportional to the current value i2 of the current I2. Namely, V3/V1, V4/V6, V9/V7, and V10/V12 each correspond to current ratio i2/i1. The effects of causes [1], [2], and [4] to [7] are reduced by averaging V3/V1, V4/V6, V9/V7, and V10/V12.

At step S43, the CPU 41 of the digital operation section 40 computes the correction coefficient K for correcting the ΔVbe (aye) computed at step S41 based on the average value C (ave) of the current ratios computed at step S42. Namely, the CPU 41 performs the computation processing represented by Equation (14) below.

$$K = \frac{\log(Co)}{\log(C(ave))} \quad (14)$$

Co is the design value N of the current ratio (1:N) between the current I1 and the current I2. Since a comparatively long computation time is needed for the logarithmic computation, the correction coefficient K may be computed using an first approximation equation corresponding to log(Co)/log(C (ave)). A decrease in computation time is thereby enabled compared to when the logarithmic computation is performed At step S44, the CPU 41 of the digital operation section 40 computes the corrected value, ΔVbeo, of the ΔVbe (ave) computed at step S41 using the correction coefficient K computed at step S43. Namely, the CPU 41 performs the computation processing represented by Equation (15) below.

$$\Delta Vbeo = \Delta Vbe(ave) \times K \quad (15)$$

Performing such correction processing enables a reduction in the effect of the mismatch between the transistors M1 and M2 of the sensor 20 (cause [3]).

At step S45, the CPU 41 of the digital operation section 40 computes the temperature measurement value T based on the corrected value ΔVbeo computed at step S44. Namely, the CPU 41 performs the computation processing represented by Equation (16) below.

$$T = A + \frac{B \times \Delta Vbeo}{1 + g \times \Delta Vbeo} \quad (16)$$

Note that ΔVbe (ave) and ΔVbeo in Equation (15) are based on the value measured by the AD converter 30 with the inter-base-emitter voltage Vbe of the transistor Q1 or Q2 of the sensor 20 as a reference voltage. Accordingly, the ΔVbe (aye) and the ΔVbeo in Equations (12) and (15) correspond to ΔVbe/Vbe in Equation (4). Moreover, Equation (16) corresponds to Equations (3) and (4). By performing the above computation processing in the digital operation section 40, a temperature measurement value T can be obtained for which all of the effects of causes [1] to [7] are reduced.

According to the temperature measurement device 10, circuit connections in the sensor 20 and the current source 50 are switched by the first to the fifth switching sections 21, 22, 51, 52, 56, forming the first and the second current control states, and the first and the second sensing states. Each of the voltages measured by the AD converter 30 under each of the above states are stored in the digital operation section 40 as the digital values V1 to V12. The digital operation section 40 computes the temperature measurement value T based on the stored digital values V1 to V12. The digital operation section 40 computes the temperature measurement value T based on the stored digital values V1 to V12. In this manner, according to the temperature measurement device 10, the plural states for acquiring the digital values V1 to V12 used in the computation processing in the digital operation section 40 are formed by switching of the circuit connections by the first to the fifth switching sections 21, 22, 51, 52, 56. The temperature measurement value T for which the effects of mismatches and the like between respective elements are reduced is acquired by the digital operation section 40 performing digital computation processing based on the digital values V1 to V12. Accordingly, according to the temperature measurement device 10, enlargement of the circuit scale of an analog circuit can be avoided, and an increase in circuit surface area and an increase in power consumption can be avoided.

In this manner, the temperature measurement device 10 according to exemplary embodiments of technology disclosed herein enables an increase in temperature measurement precision to be achieved while suppressing an increase in circuit surface area.

Figure 18:
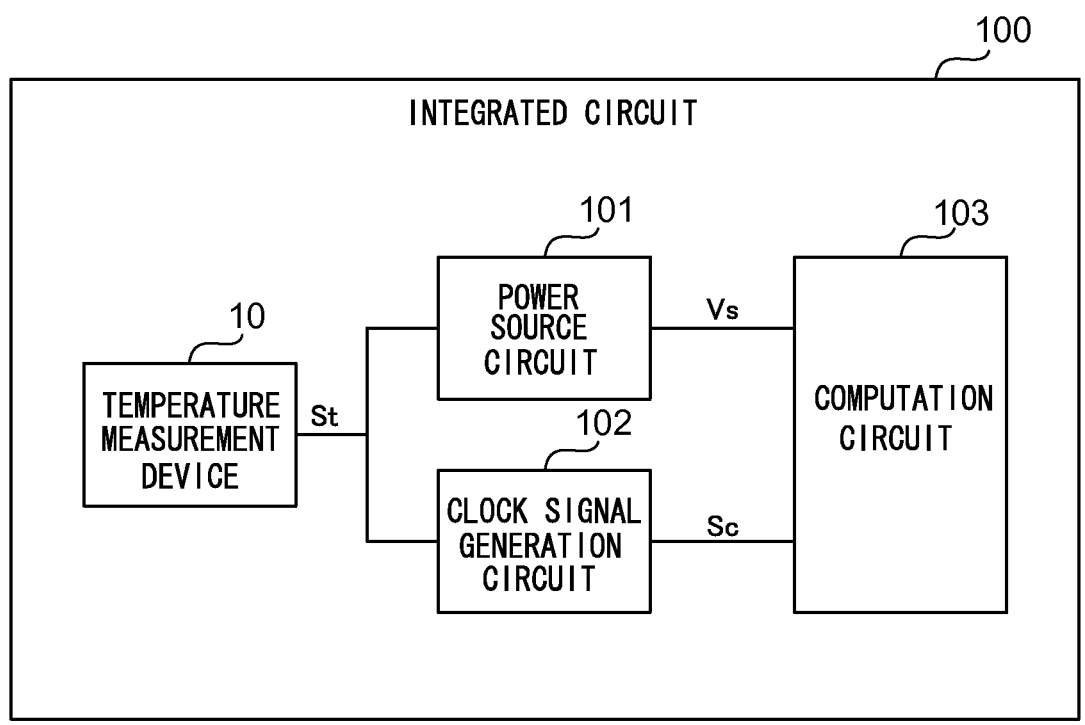
FIG. 18 is a block diagram illustrating an example of a configuration of an integrated circuit 100 provided with a temperature measurement device according to an exemplary embodiment of technology disclosed herein.

Explanation follows regarding example applications of the temperature measurement device 10. FIG. 18 is a block diagram illustrating an example of a configuration of an integrated circuit 100 provided with the temperature measurement device 10. The integrated circuit 100 includes the temperature measurement device 10, a power source circuit 101, a clock signal generation circuit 102, and a computation circuit 103. The integrated circuit 100 is an example of an integrated circuit of technology disclosed herein. The power source circuit 101 and the clock signal generation circuit 102 are examples of functional sections of technology disclosed herein.

The computation circuit 103 is driven by a power source voltage Vs supplied from the power source circuit 101, and synchronizes with a clock signal Sc supplied from the clock signal generation circuit 102 to perform computation processing. The temperature measurement device 10 supplies a temperature detection signal St indicating the temperature measurement value T computed in the digital operation section 40 (omitted from illustration in FIG. 18) to the power source circuit 101 and the clock signal generation circuit 102.

The power source circuit 101 changes the magnitude of the power source voltage Vs based on the temperature measurement value T indicated by the temperature detection signal St supplied from the temperature measurement device 10. The power source circuit 101, for example, lowers the power source voltage Vs in response to an increase in the temperature measurement value T indicated by the temperature detection signal St.

The clock signal generation circuit 102 changes the frequency of the clock signal Sc based on the temperature detection signal St supplied from the temperature measurement device 10. The clock signal generation circuit 102, for example, lowers the frequency of the clock signal Sc in response to an increase in the temperature measurement value T indicated by the temperature detection signal St.

Using a control method known as Dynamic Voltage Frequency Scaling (DVFS) that changes the frequency of the clock signal Sc and the power source voltage Vs supplied to the computation circuit 103 in the integrated circuit 100 in response to temperature enables a reduction in power consumption to be achieved. The temperature measurement device 10 may take the form of a stand-alone integrated circuit (IC), and may be widely employed in applications in which temperature is measured by the IC.

Although an example has been given in the exemplary embodiment above regarding a case that addresses all of the temperature measurement precision deterioration causes [1] to [7], the processing in the temperature measurement device 10 may be simplified by addressing only some of the causes [1] to [7].

Figure 19:
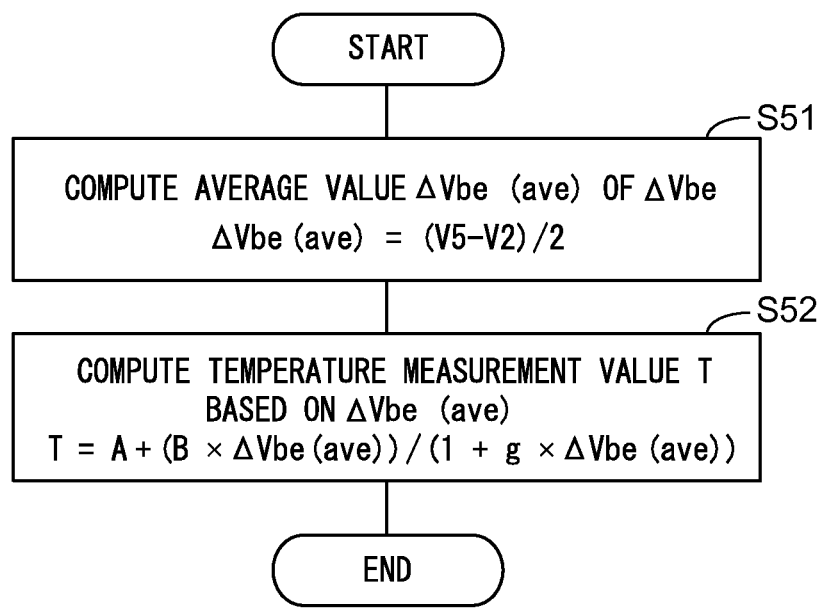
FIG. 19 is a flowchart illustrating a flow of processing in a temperature computation processing program according to an exemplary embodiment of technology disclosed herein.

FIG. 19 is a flowchart illustrating a flow of computation processing, implemented by the CPU 41 of the digital operation section 40, according to a first modified example.

At step S51, the CPU 41 of the digital operation section 40 reads the digital values V2, V5 corresponding to the ΔVbe stored in the register 42, and performs the computation processing represented by Equation (17) below.

$$\Delta Vbe(ave) = \frac{V5 - V2}{2} \quad (17)$$

At step S52, the CPU 41 of the digital operation section 40 computes the temperature measurement value T based on the corrected value ΔVbe (aye) computed at step S51. Namely, the CPU 41 performs the computation processing represented by Equation (18) below.

$$T = A + \frac{B \times \Delta Vbe(ave)}{1 + g \times \Delta Vbe(ave)} \quad (18)$$

According to the temperature computation processing according to the first modified example, the effects of the mismatch between the transistors Q1 and Q2 of the sensor 20 (cause [1]), and the mismatch between the resistor elements R1 and R2 of the sensor 20 (cause [2]), are reduced in the temperature measurement value T. The effect of the offset of the AD converter 30 (cause [4]) is also reduced in the temperature measurement value T. When computing the temperature measurement value T using the temperature computation processing according to the first modified example, processing for acquiring the digital values other than the digital values V2 and V5 may be omitted from the above measurement control processing (see FIG. 6, and FIG. 7) as appropriate. Although simplifying the computation processing in this manner reduces the precision of the temperature measurement value T, it also enables a reduction in processing time to be achieved for the measurement control processing and the temperature computation processing.

Figure 20:
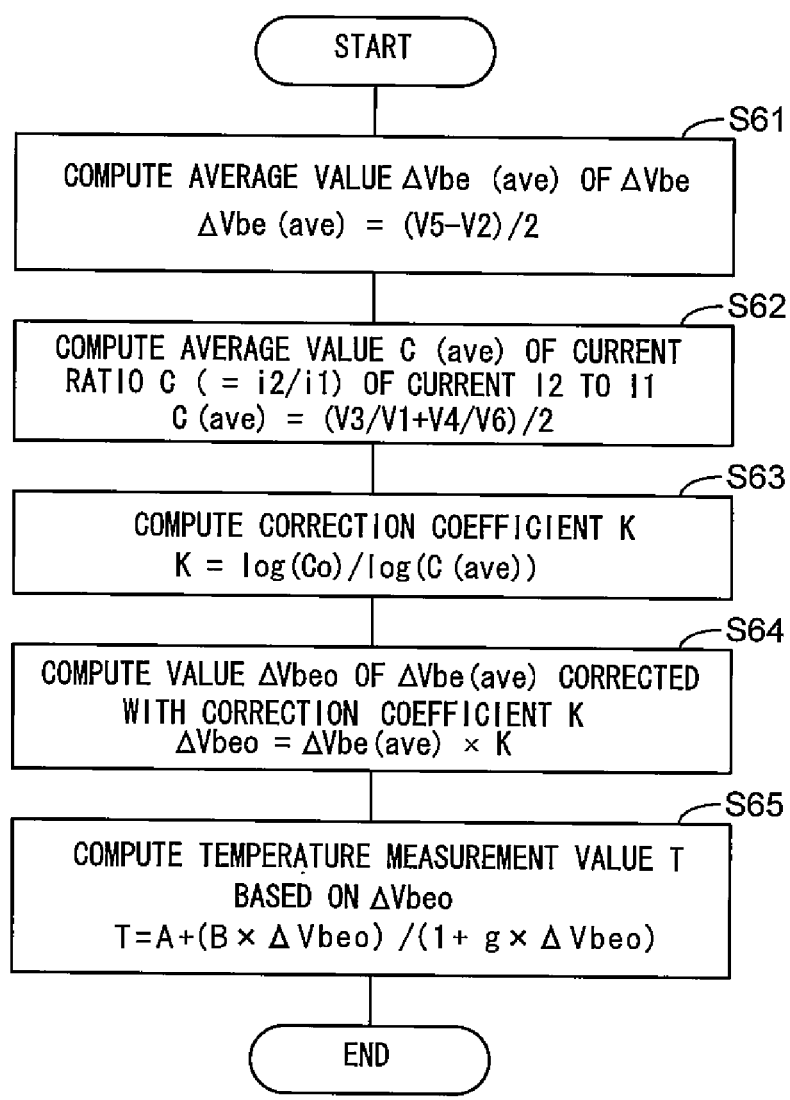
FIG. 20 is a flowchart illustrating a flow of processing in a temperature computation processing program according to an exemplary embodiment of technology disclosed herein.

FIG. 20 is a flowchart illustrating a flow of temperature computation processing, implemented by the CPU 41 of the digital operation section 40, according to a second modified example.

At step S61, the CPU 41 of the digital operation section 40 reads the digital values V2, V5 corresponding the ΔVbe stored in the register 42, and computes ΔVbe (ave) by performing the computation processing represented by Equation (17).

At step S62, the CPU 41 of the digital operation section 40 reads the digital values V1, V3, V4, V6 stored in the register 42, and computes the average value C (ave) of the current ratio between the current I1 and the current I2 by performing the computation processing represented by Equation (19) below.

$$C(ave) = \frac{V3/V1 + V4/V6}{2} \quad (19)$$

At step S63, the digital operation section 40 of the CPU 41 computes the correction coefficient K for correcting the ΔVbe (ave) computed at step S61, based on the average value C (ave) of the current ratio computed at step S62. Namely, the CPU 41 performs the computation processing represented by the above Equation (14).

At step S64, the CPU 41 of the digital operation section 40 computes the corrected value ΔVbeo of the ΔVbe (ave) computed at step S61 using the correction coefficient K computed at step 63. Namely, the CPU 41 performs the computation processing represented by Equation (15) above.

At step S65, the CPU 41 of the digital operation section 40 computes the temperature measurement value T based on the corrected value ΔVbeo computed at step S64. Namely, the CPU 41 performs the computation processing represented by Equation (16) above.

According to the temperature computation processing according to the second modified example, the effects of the mismatch between the transistors Q1 and Q2 of the sensor 20 (cause [1]), and the mismatch between the resistor elements R1 and R2 of the sensor 20 (cause [2]), are reduced in the temperature measurement value T. The effects of the mismatch between the transistors M1 and M2 (cause [3]), and the offset of the AD converter 30 (cause [4]) are also reduced in the temperature measurement value T. When the temperature measurement value T is computed by the temperature computation processing according to the second modified example, the processing for acquiring the digital values other than the digital values V1 to V6 may be omitted from the above measurement control processing (see FIG. 6, and FIG. 7) as appropriate. Although simplifying the computation processing in this manner reduces the precision of the temperature measurement value T, a reduction in processing time is enabled in the measurement control processing and the temperature computation processing.

Second Exemplary Embodiment

The digital operation section 40 and the controller 60 that configure the temperature measurement device 10 according to the first exemplary embodiment above include a computer that includes a CPU, and the temperature computation processing and the measurement control processing above are implemented by software. In contrast thereto, a digital operation section 40 and a controller 60 according to the second exemplary embodiment, implement the respective temperature computation processing and measurement control processing using hardware logic.

Figure 21:
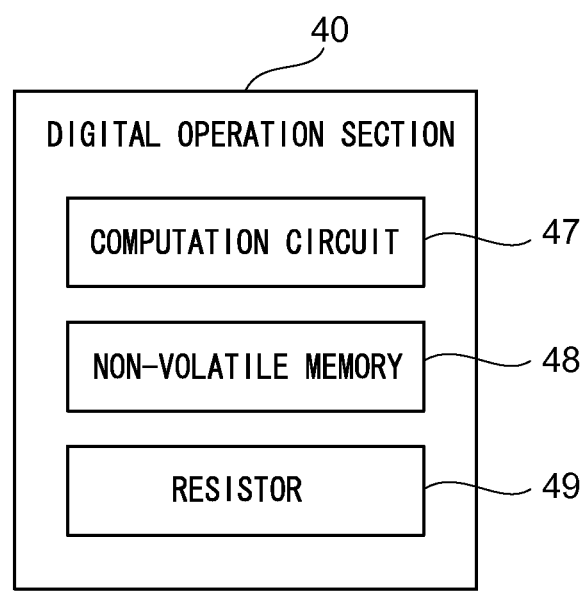
FIG. 21 is a block diagram illustrating a configuration of a digital computation section according to an exemplary embodiment of technology disclosed herein.

FIG. 21 is a block diagram illustrating an example of a configuration of the digital operation section 40 according to the second exemplary embodiment in which the above temperature computation processing is implemented by hardware logic. The digital operation section 40 according to the second exemplary embodiment includes a computation circuit 47, non-volatile memory 48, and a resistor 49.

The computation circuit 47 is a hardware logic circuit that performs predetermined logical computations for computing the temperature measurement value T. The non-volatile memory 48 is a recording medium that stores a conversion coefficient for computing the temperature measurement value T. The non-volatile memory 48 may, for example, be a programmable e-fuse. The non-volatile memory 48 may be omitted when the conversion coefficient is a fixed value. The resistor 49 is a storage circuit that holds digital values output from the AD converter 30.

According to the digital operation section 40 of the second exemplary embodiment having the above configuration, the above temperature computation processing, implemented by software in the first exemplary embodiment, can be implemented by hardware logic.

The controller 60 according to the second exemplary embodiment has the configuration below for implementing the above measurement control processing using hardware logic. The controller 60, for example, includes a counter, the control circuit that controls switching timing of the circuit connections in the first to the fifth switching sections 21, 22, 51, 52, 56, and an interface circuit for performing communication with the digital operation section 40 (all of which are omitted from illustration).

By implementing the temperature computation processing and the measurement control processing in the digital operation section 40 and the controller 60 using hardware logic, an increase in the speed of the processing is enabled compared to when the processing is implemented using software, enabling a reduction in the circuit scale and a reduction in the power consumption to be achieved.

An aspect of technology disclosed herein exhibits the advantageous effect of enabling an increase in temperature measurement precision to be achieved in a temperature measurement device while suppressing an increase in circuit surface area.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A temperature measurement device comprising:
   a first semiconductor element and a second semiconductor element that include respective pn junctions;
   a first current output circuit configured to output a first current and a second current of a different magnitude from the first current based on a control voltage supplied to a current control terminal;
   a first connection switching circuit configured to switch connections of the first semiconductor element and the second semiconductor element with the first current output circuit so as to produce either a state of a first sensing state in which the first current flows in a forward direction with respect to the pn junction of the first semiconductor element and the second current flows in a forward direction with respect to the pn junction of the second semiconductor element, or a second sensing state in which the first current flows in the forward direction with respect to the pn junction of the second semiconductor element and the second current flows in the forward direction with respect to the pn junction of the first semiconductor element;
   an AD convertor configured to convert, in the first sensing state, a difference between a forward direction voltage of the pn junction of the first semiconductor element and a forward direction voltage of the pn junction of the second semiconductor element into a digital value and output the converted digital value as a first digital value, and configured to convert, in the second sensing state, a difference value between the forward direction voltage of the pn junction of the first semiconductor element and the forward direction voltage of the pn junction of the second semiconductor element into a digital value and output the converted digital value as a second digital value;

a computation circuit configured to compute a temperature measurement value based on an average value of the first digital value and the second digital value;

a first resistor element configured to cause a voltage drop according to current flowing in the first semiconductor element; and a second resistor element configured to cause a voltage drop according to current flowing in the second semiconductor element, wherein:

the AD convertor is further configured to output a third digital value obtained by converting a voltage between both ends of the first resistor element in the first sensing state into a digital value, a fourth digital value obtained by converting a voltage between both ends of the second resistor element in the first sensing state into a digital value, a fifth digital value obtained by converting a voltage between both ends of the first resistor element in the second sensing state into a digital value, and a sixth digital value obtained by converting a voltage between both ends of the second resistor element in the second sensing state into a digital value, and the computation circuit is configured to correct the average value of the first digital value and the second digital value to compute the temperature measurement value, based on the third digital value, the fourth digital value, the fifth digital value and the sixth digital value.

2. The temperature measurement device of claim 1, further comprising a second connection switching circuit provided between the first semiconductor element and the second semiconductor element, and the AD convertor, wherein:

the AD convertor includes a first input terminal and a second input terminal, and is configured to output a digital value according to a difference between a voltage of a node connected to the first input terminal and a voltage of a node connected to the second input terminal; and the second connection switching circuit is configured to switch nodes connected to the first input terminal and the second input terminal in accordance with the connection switching in the first connection switching circuit such that a polarity of the first digital value and a polarity of the second digital value are different from each other.

3. The temperature measurement device of claim 1, wherein the computation circuit is configured to compute a correction coefficient based on an average value of a ratio between the third digital value and the fourth digital value, and a ratio between the fifth digital value and the sixth digital value, and to correct the average value of the first digital value and the second digital value with the correction coefficient to compute the temperature measurement value.

4. The temperature measurement device of claim 3, wherein the computation circuit includes a storage circuit configured to store the first to the sixth digital values, and configured to compute the temperature measurement value based on the first to the sixth digital values read from the storage circuit.

5. The temperature measurement device of claim 3, further comprising:

a third semiconductor element and a fourth semiconductor element that include respective pn junctions;

a second current output circuit configured to output a third current and a fourth current of a different magnitude from the third current based on the control voltage supplied to a current control terminal;

a third connection switching circuit configured to switch connections of the third semiconductor element and the fourth semiconductor element with the second current output circuit so as to produce either a state of a first current control state in which the third current flows in a forward direction with respect to the pn junction of the third semiconductor element and the fourth current flows in a forward direction with respect to the pn junction of the fourth semiconductor element, or a second current control state in which the third current flows in the forward direction with respect to the pn junction of the fourth semiconductor element and the fourth current flows in the forward direction with respect to the pn junction of the third semiconductor element;

an operational amplifier that includes an inverting input terminal connected to one of the third semiconductor element or the fourth semiconductor element, and a non-inverting input terminal connected to the other of the third semiconductor element or the fourth semiconductor element, the operational amplifier being configured to generate, in each of the first current control state and the second current control state, the control voltage to control the magnitudes of the first to the fourth currents in accordance with a difference between the forward direction voltage in the pn junction of the third semiconductor element and the forward direction voltage in the pn junction of the fourth semiconductor element, and to supply the generated control voltage to the current control terminals of the first current output circuit and the second current output circuit;

a fourth connection switching circuit configured to switch nodes connected to the inverting input terminal and the non-inverting input terminal in accordance with the connection switching in the third connection switching circuit; and a fifth connection switching circuit configured to switch between in-phase and out-of-phase of the output voltage in the operational amplifier in accordance with the connection switching in the third connection switching circuit, wherein:

the AD convertor is configured to output the first to the sixth digital values in each of the first current control state and the second current control state, and the computation circuit is configured to compute the correction coefficient based on the average value of the ratio between the third digital value and the fourth digital value output from the AD convertor in each of the first current control state and the second current control state, and the ratio between the fifth digital value and the sixth digital value output from the AD convertor in each of the first current control state and the second current control state, and, to correct the average value of the first digital value and the second digital value respectively output from the AD convertor in each of the first current control state and the second current control state with the correction coefficient to compute the temperature measurement value.

6. The temperature measurement device of claim 1, wherein:
the first semiconductor element and the second semiconductor element are both bipolar transistors, and
the first digital value and the second digital value are digital values corresponding to a difference between a voltage between a base and an emitter of the first semiconductor element and a voltage between a base and an emitter of the second semiconductor element.

7. An integrated circuit comprising:
a first semiconductor element and a second semiconductor element that include respective pn junctions;
a first current output circuit configured to output a first current and a second current of a different magnitude from the first current in accordance with a control voltage supplied to a current control terminal;
a first connection switching circuit configured to switch connections of the first semiconductor element and the second semiconductor element with the first current output circuit so as to produce either a first sensing state in which the first current flows in a forward direction with respect to the pn junction of the first semiconductor element and the second current flows in a forward direction with respect to the pn junction of the second semiconductor element, or a second sensing state in which the first current flows in the forward direction with respect to the pn junction of the second semiconductor element and the second current flows in the forward direction with respect to the pn junction of the first semiconductor element;
an AD convertor configured to convert, in the first sensing state, a difference between a forward direction voltage of the pn junction of the first semiconductor element and a forward direction voltage of the pn junction of the second semiconductor element into a digital value and output the converted digital value as a first digital value, and configured to convert, in the second sensing state, a difference value between the forward direction voltage of the pn junction of the first semiconductor element and the forward direction voltage of the pn junction of the second semiconductor element into a digital value and output the converted digital value as a second digital value;
a computation circuit configured to compute a temperature measurement value based on an average value of the first digital value and the second digital value; and
a functional circuit configured to change an operation in accordance with the temperature measurement value;
a first resistor element configured to cause a voltage drop according to current flowing in the first semiconductor element; and
a second resistor element configured to cause a voltage drop according to current flowing in the second semiconductor element, wherein
the AD convertor is further configured to output a third digital value obtained by converting a voltage between both ends of the first resistor element in the first sensing state into a digital value, a fourth digital value obtained by converting a voltage between both ends of the second resistor element in the first sensing state into a digital value, a fifth digital value obtained by converting a voltage between both ends of the first resistor element in the second sensing state into a digital value, and a sixth digital value obtained by converting a voltage between both ends of the second resistor element in the second sensing state into a digital value, and the computation circuit is configured to correct the average value of the first digital value and the second digital value to compute the temperature measurement value, based on the third digital value, the fourth digital value, the fifth digital value and the sixth digital value.

8. The integrated circuit of claim 7, wherein the functional circuit includes a clock signal generation circuit configured to change a frequency of a clock signal in accordance with the temperature measurement value.

9. The integrated circuit of claim 7, wherein the functional circuit includes a power source circuit configured to change an output voltage in accordance with the temperature measurement value.

10. The integrated circuit of claim 7, further comprising a second connection switching circuit provided between the first semiconductor element and the second semiconductor element, and the AD convertor,
wherein:
the AD convertor includes a first input terminal and a second input terminal, and is configured to output a digital value according to a difference between a voltage of a node connected to the first input terminal and a voltage of a node connected to the second input terminal; and
the second connection switching circuit is configured to switch nodes connected to the first input terminal and the second input terminal in accordance with the connection switching in the first connection switching circuit such that a polarity of the first digital value and a polarity of the second digital value are different from each other.

11. The integrated circuit of claim 7, wherein:
the computation circuit is configured to compute a correction coefficient based on an average value of a ratio between the third digital value and the fourth digital value, and a ratio between the fifth digital value and the sixth digital value, and to correct the average value of the first digital value and the second digital value with the correction coefficient to compute the temperature measurement value.

12. The integrated circuit of claim 11, wherein the computation circuit includes a storage circuit configured to store the first to the sixth digital values, and configured to compute the temperature measurement value based on the first to the sixth digital values read from the storage circuit.

13. The integrated circuit of claim 11, further comprising:
a third semiconductor element and a fourth semiconductor element that include respective pn junctions;
a second current output circuit configured to output a third current and a fourth current of a different magnitude from the third current in accordance with the control voltage supplied to a current control terminal;
a third connection switching circuit configured to switch connections of the third semiconductor element and the fourth semiconductor element with the second current output circuit so as to produce either a first current control state in which the third current flows in a forward direction with respect to the pn junction of the third semiconductor element and the fourth current flows in a forward direction with respect to the pn junction of the fourth semiconductor element, or a second current control state in which the third current flows in the forward direction with respect to the pn junction of the fourth semiconductor element and the fourth current flows in the forward direction with respect to the pn junction of the third semiconductor element;

an operational amplifier that includes an inverting input terminal connected to one of the third semiconductor element or the fourth semiconductor element, and a non-inverting input terminal connected to the other of the third semiconductor element or the fourth semiconductor element, the operational amplifier being configured to generate in each of the first current control state and the second current control state, the control voltage to control the magnitudes of the first to the fourth currents in accordance with a difference between the forward direction voltage in the pn junction of the third semiconductor element and the forward direction voltage in the pn junction of the fourth semiconductor element, and to supply the generated control voltage to the current control terminals of the first current output circuit and the second current output circuit;

a fourth connection switching circuit configured to switch nodes connected to the inverting input terminal and the non-inverting input terminal in accordance with the connection switching in the third connection switching circuit; and a fifth connection switching circuit configured to switch between in-phase and out-of-phase of the output voltage in the operational amplifier in accordance with the connection switching in the third connection switching circuit, wherein:

the AD convertor is configured to output the first to the sixth digital values in each of the first current control state and the second current control state, and the computation circuit is configured to compute the correction coefficient based on the average value of the ratio between the third digital value and the fourth digital value output from the AD convertor in each of the first current control state and the second current control state, and the ratio between the fifth digital value and the sixth digital value output from the AD convertor in each of the first current control state and the second current control state, and to correct the average value of the first digital value and the second digital value respectively output from the AD convertor in each of the first current control state and the second current control state with the correction coefficient to compute the temperature measurement value.

14. The integrated circuit of claim 7, wherein:
the first semiconductor element and the second semiconductor element are both bipolar transistors, and
the first digital value and the second digital value are digital values corresponding to a difference between a voltage between a base and an emitter of the first semiconductor element and a voltage between a base and an emitter of the second semiconductor element.

15. A temperature measurement method comprising:
in a first sensing state in which a first current flows in a forward direction with respect to a pn junction of a first semiconductor element and a second current of a different magnitude from the first current flows in a forward direction with respect to a pn junction of a second semiconductor element, converting, by a processor, a difference between a forward direction voltage in the pn junction of the first semiconductor element and the forward direction voltage in the pn junction of the second semiconductor element converted into a digital value to acquire a first digital value;
in a second sensing state in which the second current flows in the forward direction with respect to the pn junction of the first semiconductor element and the first current flows in the forward direction with respect to the pn junction of the second semiconductor element, converting, by the processor, a difference between the forward direction voltage in the pn junction of the first semiconductor element and the forward direction voltage in the pn junction of the second semiconductor element converted to a digital value to acquire a second digital value;
computing, by the processor, a temperature measurement value based on an average value of the first digital value and the second digital value;
in the first sensing state, converting a voltage between both ends of a first resistor element configured to cause a voltage drop according to the current flowing in the first semiconductor element into a digital value to acquire a third digital value;
in the first sensing state, converting a voltage between both ends of a second resistor element configured to cause a voltage drop according to the current flowing in the second semiconductor element into a digital value to acquire a fourth digital value;
in the second sensing state, converting a voltage between both ends of the first resistor element into a digital value to acquire a fifth digital value; and
in the second sensing state, converting a voltage between both ends of the second resistor element into a digital value to acquire a sixth digital value,
wherein the computing corrects the average value of the first digital value and the second digital value to compute the temperature measurement value, based on the third digital value, the fourth digital value, the fifth digital value and the sixth digital value.

16. The temperature measurement method of claim 15, comprising:
acquiring the first digital value and the second digital value with an AD convertor that includes a first input terminal and a second input terminal and that is configured to output a digital value according to a difference between a voltage of a node connected to the first input terminal and a voltage of a node connected to the second input terminal; and
switching nodes connected to the first input terminal and the second input terminal in accordance with a state transition between the first sensing state and the second sensing state so that the first digital value and the second digital value are output from the AD convertor at mutually different polarities.

17. The temperature measurement method of claim 15, wherein the computing includes computing a correction coefficient based on an average value of a ratio between the third digital value and the fourth digital value, and a ratio between the fifth digital value and the sixth digital value, and, correcting the average value of the first digital value and the second digital value with the correction coefficient.

18. The temperature measurement method of claim 17, comprising:
controlling first to fourth currents with a third semiconductor element that includes a pn junction at which one of the third current and the fourth current of a different magnitude from the third current flows, a fourth semiconductor element that includes a pn junction at which the other of the third current and the fourth current flows, and an operational amplifier that includes an inverting input terminal connected to one of the third semiconductor element and the fourth semiconductor element, and a non-inverting input termninal connected to the other of the third semiconductor element and the fourth semiconductor element, and that is configured to control the magnitude of the first to the fourth currents in accordance with a difference between the forward direction voltage in the pn junction of the third semiconductor element and the forward direction voltage in the pn junction of the fourth semiconductor element;

switching nodes connected to the inverting input terminal and the non-inventing input terminal in accordance with a state transition between a first current control state in which the third current flows in a forward direction with respect to the pn junction of the third semiconductor element and the fourth current flows in the forward direction with respect to the pn junction of the fourth semiconductor element, and a second current control state in which the third current flows in the forward direction with respect to the pn junction of the fourth semiconductor element and the fourth current flows in the forward direction with respect to the pn junction of the third semiconductor element;

switching a phase of an output voltage of the operational amplifier between in-phase and out-of-phase in accordance with the state transition;

acquiring the first to the sixth digital values in each of the first current control state and the second current control state;

computing the correction coefficient based on the average value of the ratio between the third digital value and the fourth digital value acquired in each of the first current control state and the second current control state, and the ratio between the fifth digital value and the sixth digital value acquired in each of the first current control state and the second current control state; and correcting the average of the first digital value and the second digital value acquired in each of the first current control state and the second current control state with the correction coefficient to compute the temperature measurement value.

19. The temperature measurement method of claim 15, wherein:

the first semiconductor element and the second semiconductor element are both bipolar transistors, and the first digital value and the second digital value are digital values corresponding to a difference between a voltage between a base and an emitter of the first semiconductor element and a voltage between a base and an emitter of the second semiconductor element.

* * * * *